(12) United States Patent
Onda

(10) Patent No.: US 9,380,719 B2
(45) Date of Patent: Jun. 28, 2016

(54) INFORMATION APPARATUS AND LINK MECHANISM OF INFORMATION APPARATUS

(71) Applicant: FUJITSU LIMITED, Kawasaki (JP)

(72) Inventor: Nobuhiko Onda, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 380 days.

(21) Appl. No.: 13/966,695

(22) Filed: Aug. 14, 2013

(65) Prior Publication Data

US 2014/0139987 A1    May 22, 2014

(30) Foreign Application Priority Data

Nov. 16, 2012   (JP) .................. 2012-252534

(51) Int. Cl.
*G06F 1/16* (2006.01)
*H05K 5/02* (2006.01)

(52) U.S. Cl.
CPC .............. *H05K 5/0226* (2013.01); *G06F 1/16* (2013.01); *G06F 1/1616* (2013.01); *G06F 1/1624* (2013.01); *Y10T 403/32073* (2015.01)

(58) Field of Classification Search
None
See application file for complete search history.

(56) References Cited

U.S. PATENT DOCUMENTS

| 4,960,256 | A | * | 10/1990 | Chihara | G06F 1/1616 16/361 |
| 6,487,068 | B1 | * | 11/2002 | Rahemtulla | G06F 1/1616 312/223.1 |
| 6,554,242 | B2 | * | 4/2003 | Kim | F16M 11/10 211/100 |
| 6,604,722 | B1 | * | 8/2003 | Tan | F16M 11/10 248/276.1 |
| 8,250,711 | B1 | * | 8/2012 | Chen | E05D 7/081 16/239 |
| 8,339,783 | B2 | * | 12/2012 | Wu | H04M 1/0237 361/679.01 |

(Continued)

FOREIGN PATENT DOCUMENTS

| CN | 102131363 A | 7/2011 |
| JP | 4-218820 | 8/1992 |
| JP | 2002-55736 | 2/2002 |

OTHER PUBLICATIONS

Taiwanese Office Action mailed Nov. 10, 2015 in related Taiwanese Application No. 102130044.

*Primary Examiner* — Courtney Smith
*Assistant Examiner* — Rashen E Morrison
(74) *Attorney, Agent, or Firm* — Staas & Halsey LLP

(57) ABSTRACT

An information apparatus, includes: a first-housing and a second-housing; and a link mechanism spanned from a front side of the second-housing to a rear side of the first-housing in a state in which the second-housing is superposed over the first-housing, the link mechanism including a link provided with a first-rotation axis at one end and provided with a second-rotation-axis at another end, a first bracket that pivotally supports the first-rotation-axis and is provided on a side of the first-housing, a second bracket that pivotally supports the second-rotation-axis and is provided on a side of the second-housing, and an urging part that urges the link in a direction in which the second-rotation-axis moves away from the first-housing, wherein when the second-housing tilts from the first-housing, the link mechanism allows one end of the second-housing to slide over the first-housing and the second-housing tilts in an upper space of the first-housing.

20 Claims, 18 Drawing Sheets

(56) References Cited

U.S. PATENT DOCUMENTS

| | | | | |
|---|---|---|---|---|
| 8,559,623 B2* | 10/2013 | Chen | H04M 1/0237 | |
| | | | | 16/327 |
| 8,654,520 B2* | 2/2014 | Lin | G06F 1/1624 | |
| | | | | 361/679.02 |
| 8,780,544 B2* | 7/2014 | Liang | G06F 1/1683 | |
| | | | | 361/679.26 |
| 9,086,853 B2* | 7/2015 | Hu | G06F 1/1681 | |
| 9,134,755 B2* | 9/2015 | Onda | G06F 1/1601 | |
| 2008/0161075 A1* | 7/2008 | Kim | H04M 1/0237 | |
| | | | | 455/575.4 |
| 2008/0174942 A1* | 7/2008 | Yang | G06F 1/1616 | |
| | | | | 361/679.27 |
| 2008/0304217 A1* | 12/2008 | Lai | G06F 1/1616 | |
| | | | | 361/679.26 |
| 2009/0016002 A1* | 1/2009 | Lai | G06F 1/1616 | |
| | | | | 361/679.27 |
| 2011/0176261 A1* | 7/2011 | Wu | H04M 1/0237 | |
| | | | | 361/679.01 |
| 2012/0092820 A1* | 4/2012 | Hautamaki | H04M 1/0241 | |
| | | | | 361/679.02 |
| 2012/0217855 A1* | 8/2012 | Chen | G06F 1/1616 | |
| | | | | 312/323 |
| 2013/0182396 A1* | 7/2013 | Hu | G06F 1/1681 | |
| | | | | 361/729 |

* cited by examiner

INFORMATION APPARATUS AND LINK MECHANISM OF INFORMATION APPARATUS

CROSS-REFERENCE TO RELATED APPLICATION

This application is based upon and claims the benefit of priority of the prior Japanese Patent Application No. 2012-252534, filed on Nov. 16, 2012, the entire contents of which are incorporated herein by reference.

FIELD

The embodiments discussed herein are related to an information apparatus and a link mechanism of the information apparatus, which may enable a display part to tilt.

BACKGROUND

In recent years, information apparatuses, such as tablet personal computers (PCs), notebook PCs, mobile phones, and smartphones, have come into widespread use. In a typical product of the information apparatuses that have previously been in common use, a display surface of a display part is hidden inside in a state in which a body part and the display part are superposed over each other and closed, and when the display part hinged to the body part is opened, the display surface appears. In contrast, in a typical product of the information apparatuses that are now in widespread use, a display surface of a display part appears on a top side because of a touch panel, which has also come into widespread use, in a state in which a body part and the display part are superposed over each other and closed, and input may be performed through a touch panel without exposing a keyboard by opening the display part.

The above-mentioned information apparatus is disclosed in, for example, Japanese Laid-open Patent Publication No. 4-218820. In the information apparatus disclosed in Japanese Laid-open Patent Publication No. 4-218820, a body case and a display device are coupled with a support unit including a first arm and a second arm, and when the first arm is caused to slide along a long groove provided to a side surface of the body case, the display device tilts while sliding and a keyboard of the body case appears. That is, a tablet PC style in which a display device is superposed over a body case is changed into a notebook PC style in which a display device is caused to tilt and slide at the same time. In the information apparatus disclosed in Japanese Laid-open Patent Publication No. 4-218820, a tilt angle of the display device in a state in which the keyboard is exposed is changed by causing a slide axis of the first arm to engage with one of cut portions provided to the long groove on the side surface of the body case.

Japanese Laid-open Patent Publication No. 2002-55736 discloses an electronic apparatus in which a display surface of a display part appears on a top side in a state in which a body part and the display part are superposed over each other and thus, a thin lid is attached over the display surface to protect the display surface.

In the electronic apparatus disclosed in Japanese Laid-open Patent Publication No. 2002-55736, a fixing axis provided to a front end of the display part is movable along a slide rail of the body part and a rotary encoder provided to the body part and a rotation hinge provided to a central portion of the display part are coupled with a link arm.

When the display part is pulled up, the link arm rises and the fixing axis moves in the slide rail, and then the display part tilts while sliding toward the rear of the body part. A plurality of tilt angles of the display part may be set by fixing the link arm at a plurality of angles with a latch mechanism of the rotary encoder.

However, in the display device or the electronic apparatus disclosed in Japanese Laid-open Patent Publication No. 4-218820 or Japanese Laid-open Patent Publication No. 2002-55736, a lower end of the display part is moved toward the front side on which the keyboard is arranged when the tilt angle of the display part is changed after the display part has tilted from the body part, and thus, the length of the keyboard in a depth direction may be reduced and the operability may be decreased. In addition, since a space between the position of the lower end of the display part at the time of raising the display part to the highest level, and the keyboard is hidden or exposed by the tilt angle changing movement of the display part, it may be impossible to arrange a small display part, an operation button, or the like in the space and utilize the space advantageously.

SUMMARY

According to an aspect of the invention, an information apparatus, includes: a first-housing and a second-housing; and a link mechanism spanned from a front side of the second-housing to a rear side of the first-housing in a state in which the second-housing is superposed over the first-housing, the link mechanism including a link provided with a first-rotation axis at one end and provided with a second-rotation-axis at another end, a first bracket that pivotally supports the first-rotation-axis and is provided on a side of the first-housing, a second bracket that pivotally supports the second-rotation-axis and is provided on a side of the second-housing, and an urging part that urges the link in a direction in which the second-rotation-axis moves away from the first-housing, wherein when the second-housing tilts from the first-housing, the link mechanism allows one end of the second-housing to slide over the first-housing and the second-housing tilts in an upper space of the first-housing.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of the present application are described in detail below with reference to the accompanying drawings, together with specific variations. To facilitate the understanding of structures, members with substantially the same functions are given the same references and described even when the members are different in shape.

Figure 1A:
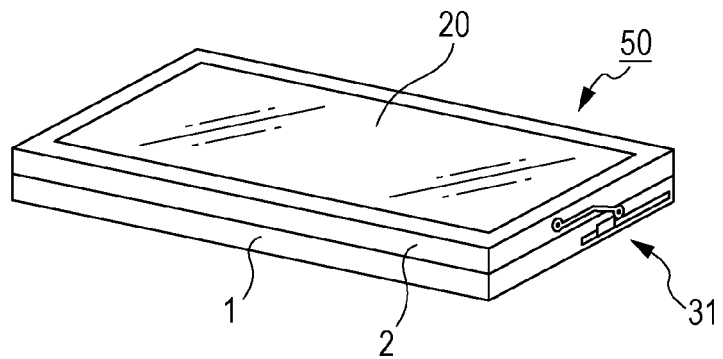
FIG. 1A is a perspective view illustrating an appearance of an information apparatus that includes a link mechanism according to a first embodiment of the present application.

FIG. 1A is a perspective view illustrating an appearance of an information apparatus 50 that includes a link mechanism 31 according to a first embodiment of the present application. The information apparatus 50 includes a body part 1 as a first housing, and a display part 2 as a second housing, and the display part 2 is provided with a touch-panel display 20. In a state in which the display part 2 is superposed over the body part 1, the touch-panel display 20 is exposed through a surface on a top side of the display part 2. The link mechanism 31 that allows the display part 2 to tilt from the body part 1 is attached to surfaces on both sides of the body part 1 and the display part 2 that are superposed over each other. In the description below, the side on which a user operates the information apparatus 50 is referred to as a front side of the information apparatus 50.

Figure 1B:
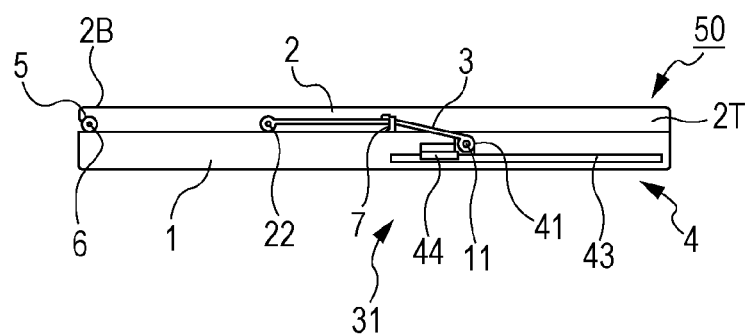
FIG. 1B is a side view illustrating the information apparatus illustrated in FIG. 1A.

As illustrated in FIG. 1B, the link mechanism 31 according to the first embodiment includes a link 3 provided with a first rotation axis 11 at one end and a second rotation axis 22 at the other end, and a slide mechanism 4 that causes the first rotation axis 11 of the link 3 to slide and be locked on the side surface of the body part 1. The slide mechanism 4 includes a slide groove 43 provided to the side surface of the body part 1, a first bracket 4 that holds the first rotation axis 11 and is movable in the slide groove 43, and a lock member 44 that locks the first bracket 41 at a desired position of the slide groove 43. The second rotation axis 22 of the link 3 is provided to the side surface of the display part 2 rotatably and positioned on the side of a base when the display part 2 tilts, and the slide mechanism 4 provided with the first bracket 41 that holds the first rotation axis 11 of the link 3 is positioned on the side surface of the body part 1, which is on the rear side of the information apparatus 50.

A lower end portion 2B positioned on the lower side when the display part 2 tilts is provided with a running roller 5 attached to a tilt rotation axis 6, and an upper surface of the body part 1 is provided with a rotation axis support part 7 that stops movement of the tilt rotation axis 6 when the running roller 5 moves over a surface of the body part 1.

Figure 1C:
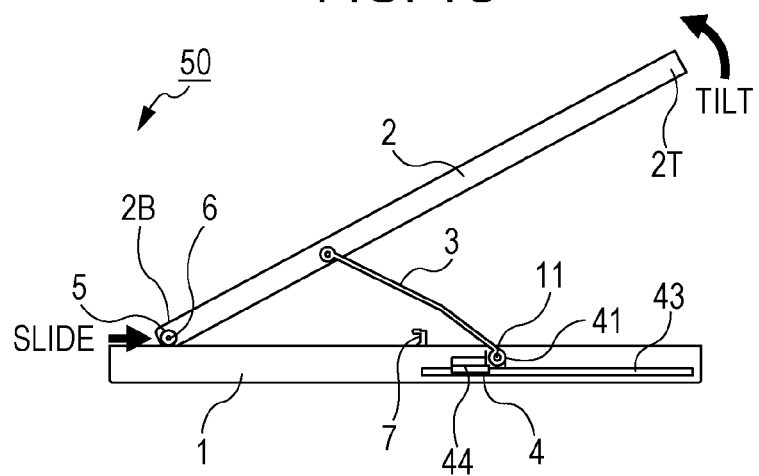
FIG. 1C is a side view illustrating a state in which the link mechanism allows a display part to start tilting from a body part.

As illustrated in FIG. 1C, when the link mechanism 31 allows the display part 2 to start sliding and tilting movement from the body part 1, the link 3 spanned between the body part 1 and the display part rotates about the first rotation axis 11. After that, when the running roller 5 provided to the lower end portion 2B of the display part 2 runs over the body part 1, the lower end portion 2B slides and moves. As the running roller 5 runs over the body part 1, an upper end portion 2T of the display part 2 tilts. Since the lock member 44 fixes the first bracket 41 to the slide groove 43 at this time, the first rotation axis 11 of the link 3 remains unmoved.

Figure 2A:
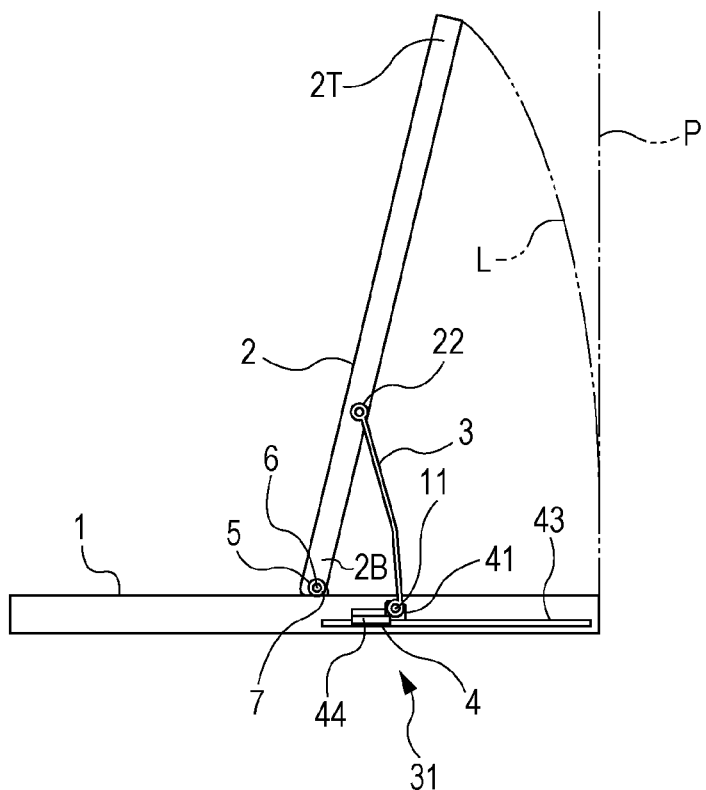
FIG. 2A is a side view illustrating a state in which the display part is further tilted from the state illustrated in FIG. 1C and the tilting movement is completed.

FIG. 2A illustrates a state in which the display part 2 is further tilted from the state illustrated in FIG. 1C, the tilt rotation axis 6 of the running roller 5 is stopped by the rotation axis support part 7, and the tilting movement is completed. Due to the movement of the link mechanism 31 according to the first embodiment, a track L along which the upper end portion 2T of the display part 2 moves before the display part 2 tilts from the body part 1 and the tilting movement is completed does not exceed a perpendicular line P toward the rear side, which is drawn in an end portion on the rear side of the body part 1. Thus, the information apparatus 50 to which the link mechanism 31 according to the first embodiment is attached may be tilted even in a place with little space on the rear side of the body part 1.

Figure 2B:
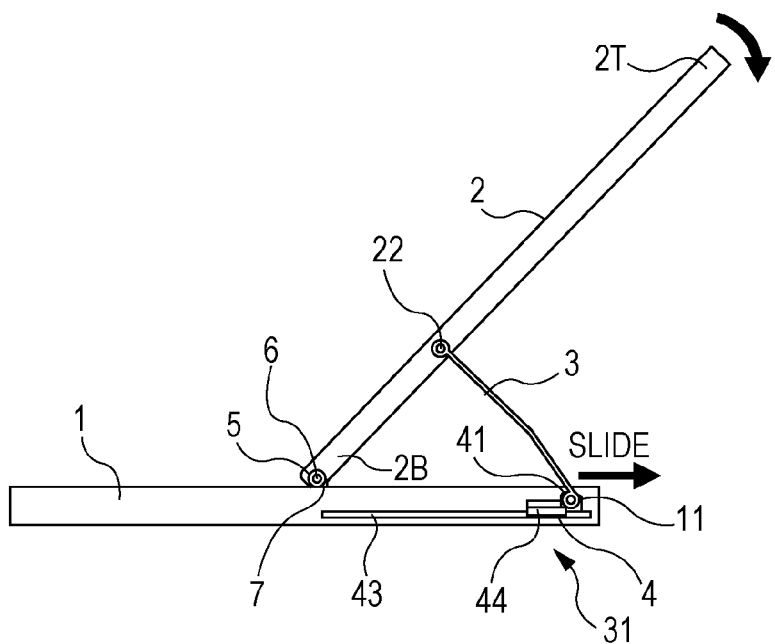
FIG. 2B is a side view illustrating a state in which a tilt angle of the display part is changed with a slide mechanism from the state illustrated in FIG. 2A.

In contrast, the information apparatus 50 to which the link mechanism 31 according to the first embodiment is attached may change a tilt angle of the display part 2 in a place with much space on the rear side of the body part 1 without shifting the position of the lower end portion 2B of the display part 2. This movement is described with reference to FIG. 2B. As illustrated in FIG. 2A, in the state in which the tilting movement of the display part 2 is completed, the tilt rotation axis 6 of the running roller 5 is stopped by the rotation axis support part 7. When in this state, the lock member 44 of the slide mechanism 4 is unlocked and the first bracket 41 is caused to slide in the slide groove 43 toward the rear side of the body part 1, the display part 2 rotates about the tilt rotation axis 6 and the tilt angle may be changed as illustrated in FIG. 2B.

Figure 3A:
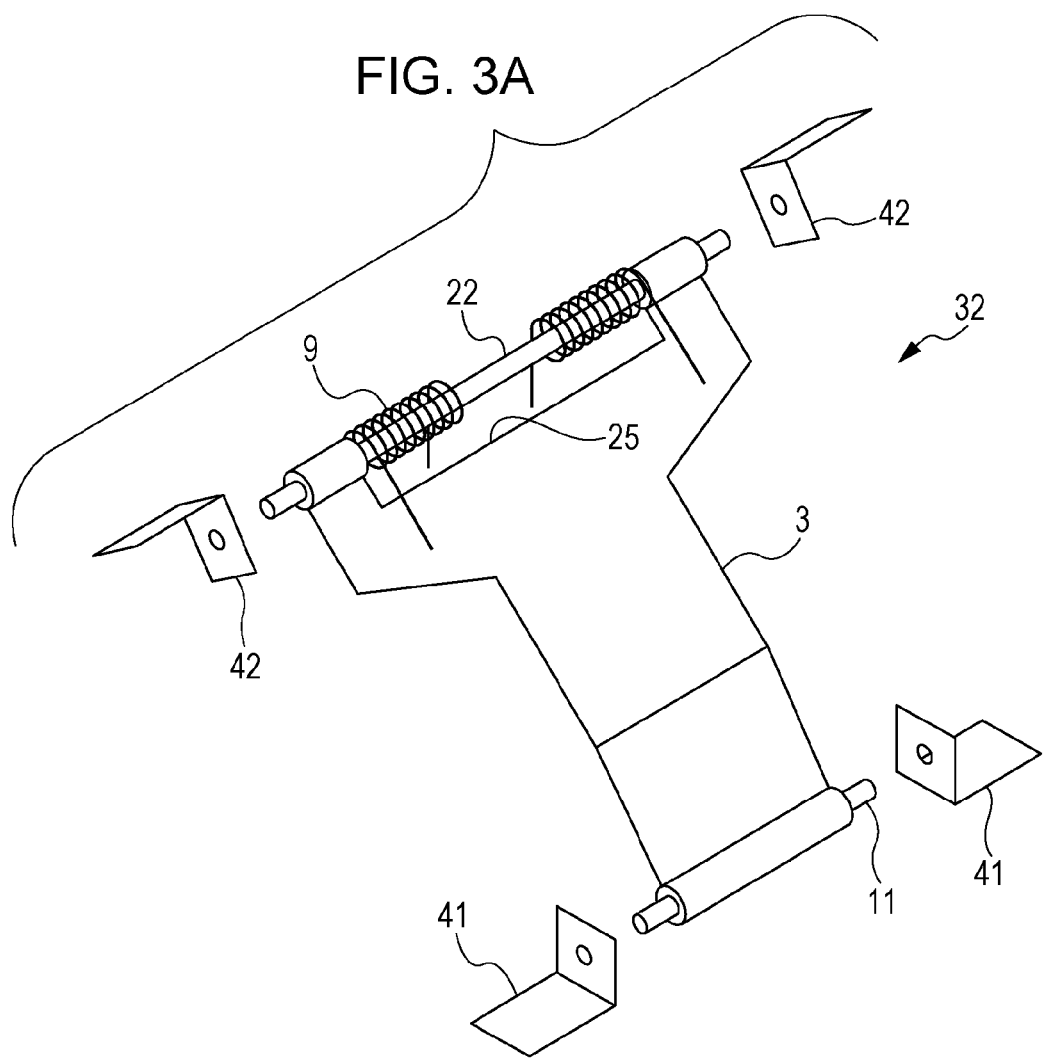
FIG. 3A is an exploded perspective view illustrating a structure of a link mechanism according to a second embodiment of the present application attached to the information apparatus.

Next, a link mechanism 32 according to a second embodiment of the present application is described. In contrast to the link mechanism 31 according to the first embodiment, which is attached to the surfaces on both sides of the body part 1 and the display part 2, the link mechanism 32 according to the second embodiment is attached between the upper surface of the body part 1 and a back surface of the display part 2. FIG. 3A is an exploded perspective view illustrating a structure of the link mechanism 32 according to the second embodiment attached to the information apparatus 50.

The link mechanism 32 according to the second embodiment includes a link 3 provided with a first rotation axis 11 at one end and a second rotation axis 22 at the other end, a first bracket 41, a second bracket 42, and an assistance spring 9 that serves as an urging part provided to the second rotation axis 22. In the second embodiment, the link 3 is shaped like a plate, widened on the side of the display part 2, and provided with a cut portion 25 at one end. The second rotation axis 22 is provided so as to cross the cut portion 25 and both end portions of the second rotation axis 22 are pivotally supported by the second brackets 42. The second rotation axis 22 positioned in the cut portion 25 is inserted into and extends through the two assistance springs 9, and the second brackets 42 that pivotally support the second rotation axis 22 are attached to the display part 2. Both end portions of the first rotation axis 11 are pivotally supported by the first brackets 41 and the first brackets 41 are attached to the body part 1. The shape of the link 3 is not limited to the shape described in the present embodiment.

Figure 3B:
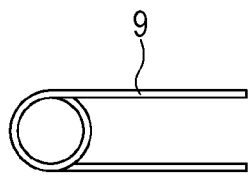
FIG. 3B is a plan view illustrating a spring used for the link mechanism illustrated in FIG. 3A.
Figure 3C:
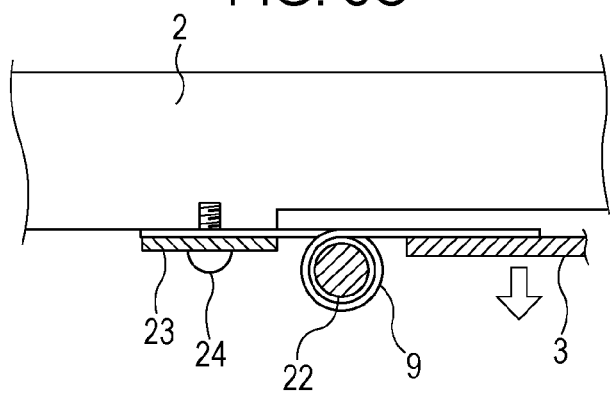
FIG. 3C is a partial sectional view illustrating a state in which the spring illustrated in FIG. 3B is attached to a display part and the link mechanism.

A torsion spring may be used as the assistance spring 9 as illustrated in FIG. 3B. The assistance spring 9 is attached between the link 3 and the display part 2 in a state in which both ends of the assistance spring 9 are open as illustrated in FIG. 3C. The end of the assistance spring 9 on the side of the display part 2 is fixed to the display part 2 with a holding plate 23 and a screw 24. FIG. 3C illustrates a state of the link 3 when the display part 2 is superposed over the body part 1, and since the assistance spring 9 in this state tries to return to the state illustrated in FIG. 3B, the link 3 is pushed because of the assistance spring 9 in a direction indicated by an arrow. The direction indicated by the arrow is a direction in which the first rotation axis 11 of the link 3 moves away from the display part 2.

Figure 4A:
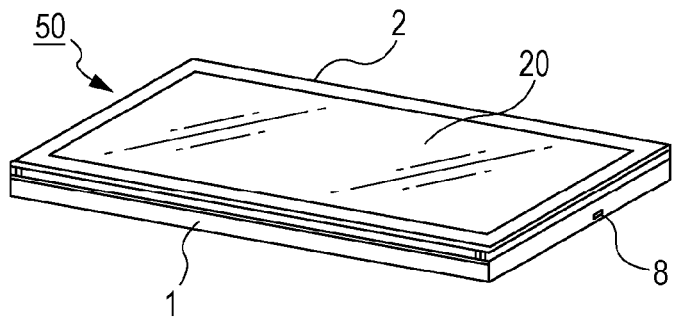
FIG. 4A is a perspective view illustrating a state in which the information apparatus including the link mechanism according to the second embodiment is closed.
Figure 5A:
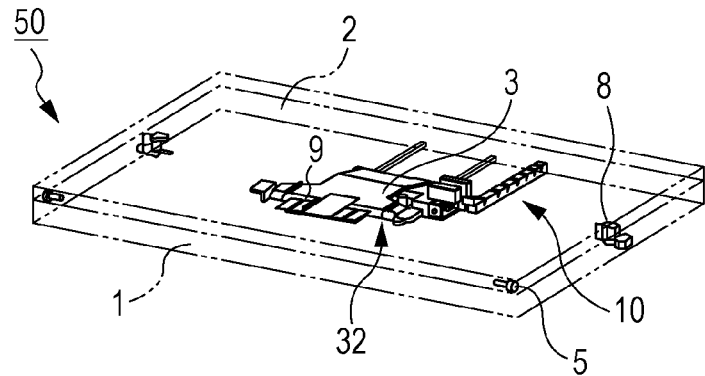
FIG. 5A is a skeleton view of the information apparatus illustrating attachment positions of the link mechanism, a running roller, a slide and lock mechanism, and a close lock mechanism according to the second embodiment, which are attached to the information apparatus illustrated in FIG. 4A.
Figure 6A:
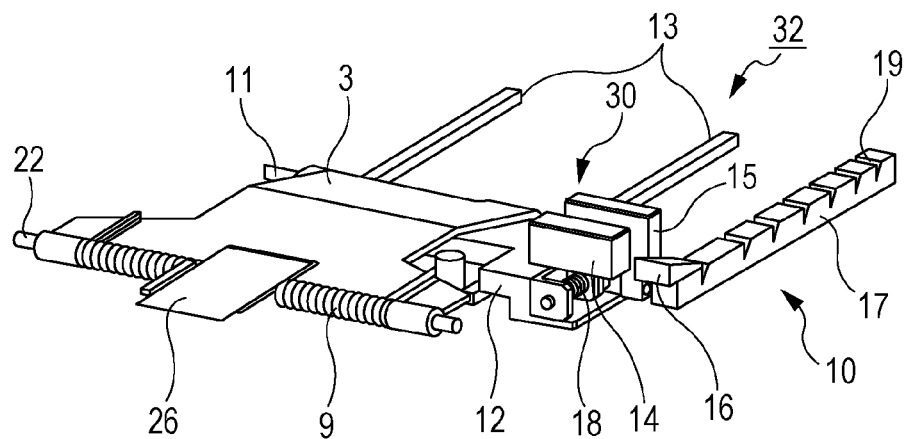
FIG. 6A is a perspective view enlarging and illustrating only the link mechanism according to the second embodiment illustrated in FIG. 5A.

FIG. 4A is a perspective view illustrating a state in which the information apparatus 50 including the link mechanism 32 according to the second embodiment between the body part 1 and the display part 2 is closed, and FIG. 5A is a skeleton view of FIG. 4A. FIG. 6A is a perspective view enlarging and illustrating the link mechanism 32 by taking only the link mechanism 32 out of FIG. 5A, and illustrates a state in which the link mechanism 32 is closed. As illustrated in FIG. 4A, an upper surface of the display part 2 superposed over the body part 1 is provided with a touch-panel display 20. Electrical coupling between the body part 1 and the display part 2 is performed using a flexible printed circuit (FPC) 26 arranged along the link 3 of the link mechanism 32 as illustrated in FIG. 6A. Further, the rear of the link mechanism 32 is provided with a slide and lock mechanism 10 that includes a slide plate 12, slide rails 13, a slide lever 14, an unlock lever 15, a lock hook 16, a lock-groove rail 17 with lock grooves 19, and an unlock lever urging member 18. The slide and lock mechanism 10 will be described later.

When the link mechanism 32 according to the second embodiment is provided between the body part 1 and the display part 2, the second rotation axis 22 of the link 3 is urged by the assistance spring 9 in a direction away from the body part 1, and then the display part 2 is urged in a direction in which the display part 2 opens from the body part 1. Thus, a close lock mechanism 8 is provided between the body part 1 and the display part 2 as illustrated in FIGS. 4A and 5A, and the display part 2 is caused not to open from the body part 1 in the state in which the display part 2 is superposed over the body part 1 of the information apparatus 50. The structure of the close lock mechanism 8 will be described later.

When the lock of the close lock mechanism 8 is undone in the state in which the display part 2 is superposed over the body part 1 of the information apparatus 50 illustrated in FIGS. 4A and 5A, the link mechanism 32 allows the display part 2 to open from the body part 1. When the display part 2 opens from the body part 1, the link mechanism 32 allows the display part 2 to automatically slide with respect to the body part 1 and start tilting as illustrated in the perspective view in FIG. 4B and the skeleton view in FIG. 5B. FIG. 6B is a perspective view enlarging and illustrating the link mechanism 32 by taking only the link mechanism 32 out of FIG. 5B. A running roller 5 provided to a lower end portion 2B of the display part 2 runs over the upper surface of the body part 1 at this time, and an upper end portion 2T of the display part 2 gradually tilts with respect to the body part 1.

Figure 4B:
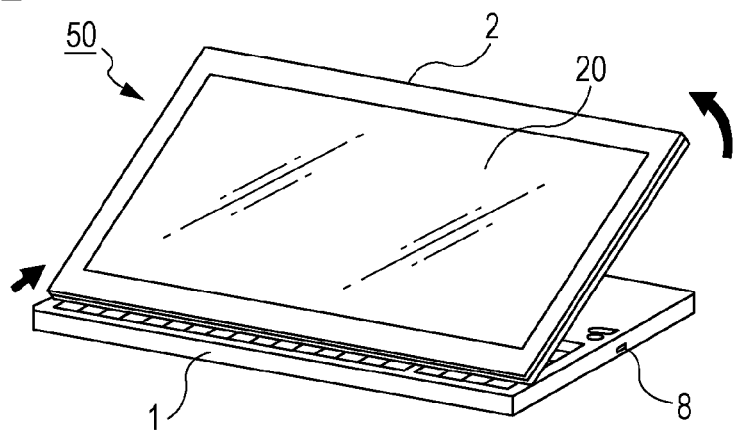
FIG. 4B is a perspective view illustrating a state in which the display part of the information apparatus illustrated in FIG. 4A starts sliding and tilting movement from a body part.
Figure 4C:
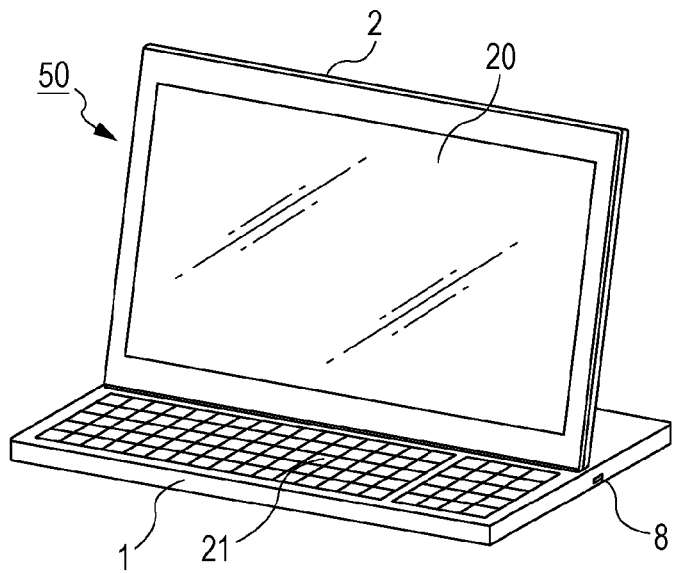
FIG. 4C is a perspective view illustrating a state in which the display part further performs the sliding and tilting movement from the state illustrated in FIG. 4B, and the sliding and tilting movement is completed.
Figure 5B:
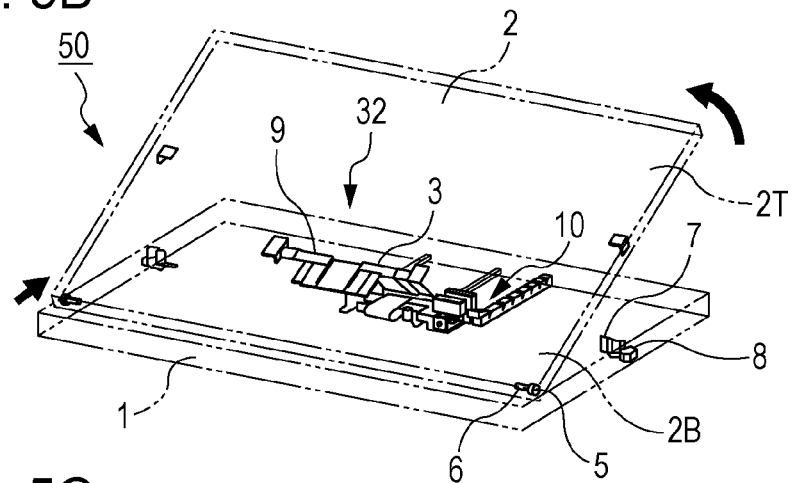
FIG. 5B is a skeleton view of the information apparatus corresponding to the state illustrated in FIG. 4B, which illustrates a movement state of the link mechanism, the running roller, the slide and lock mechanism, and the close lock mechanism according to the second embodiment when the display part starts the sliding and tilting movement from the state illustrated in FIG. 5A.
Figure 5C:
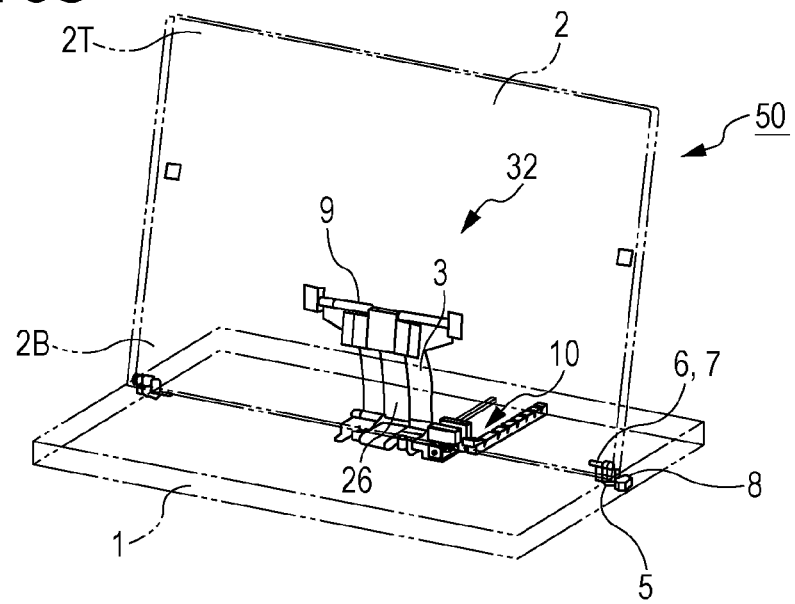
FIG. 5C is a skeleton view of the information apparatus corresponding to the state illustrated in FIG. 4C, which illustrates a movement state of the link mechanism, the running roller, the slide and lock mechanism, and the close lock mechanism according to the second embodiment when the display part further performs the sliding and tilting movement from the state illustrated in FIG. 5B and the sliding and tilting movement is completed.
Figure 6B:
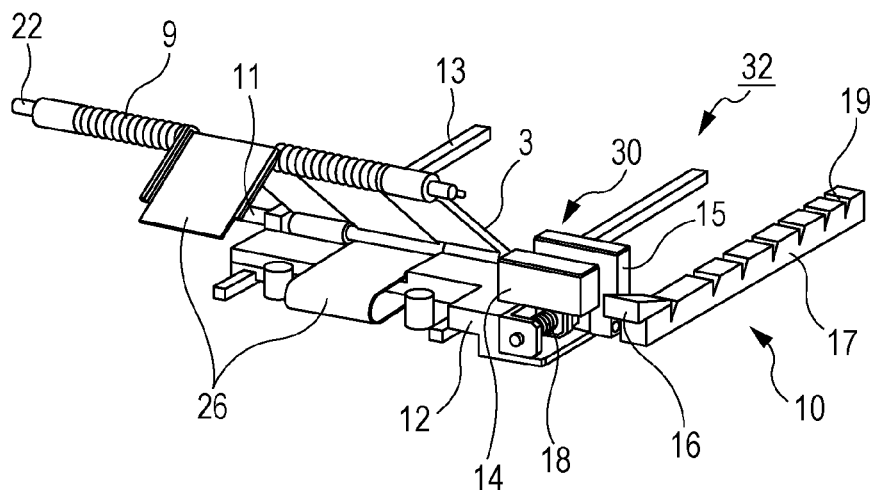
FIG. 6B is a perspective view enlarging and illustrating only the link mechanism according to the second embodiment illustrated in FIG. 5B.
Figure 7A:
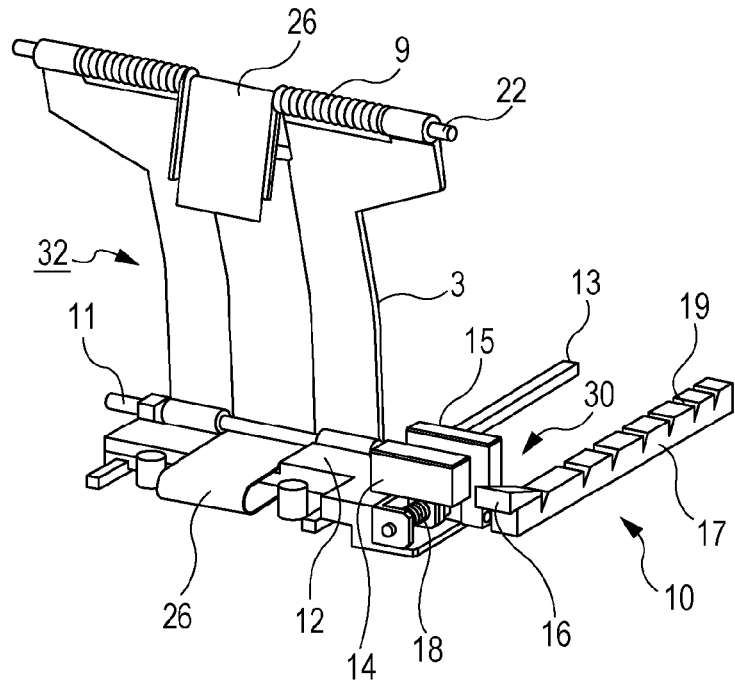
FIG. 7A is a perspective view enlarging and illustrating only the link mechanism according to the second embodiment illustrated in FIG. 5C.

When the running roller 5 provided to the lower end portion 2B of the display part 2 further runs over the upper surface of the body part 1 from the state illustrated in FIGS. 4B and 5B, the state illustrated in the perspective view in FIG. 4C and the skeleton view in FIG. 5C is obtained. FIG. 7A is a perspective view enlarging and illustrating the link mechanism 32 by taking only the link mechanism 32 out of FIG. 5C. In this state, as illustrated in FIG. 5C, a rotation axis 6 of the running roller 5 positioned in the lower end portion 2B of the display part 2 is stopped by a rotation axis support part 7, the lower end portion 2B of the display part 2 slides no further over the body part 1, and the sliding and tilting movement of the display part 2 is completed. When the sliding and tilting movement of the display part 2 is completed, a keyboard 21 appears on the upper surface of the body part 1. Further, as may be seen in FIGS. 6A, 6B, and 7A, the FPC 26 arranged along the link mechanism 32 is deformed with the movement of the link 3.

Figure 8A:
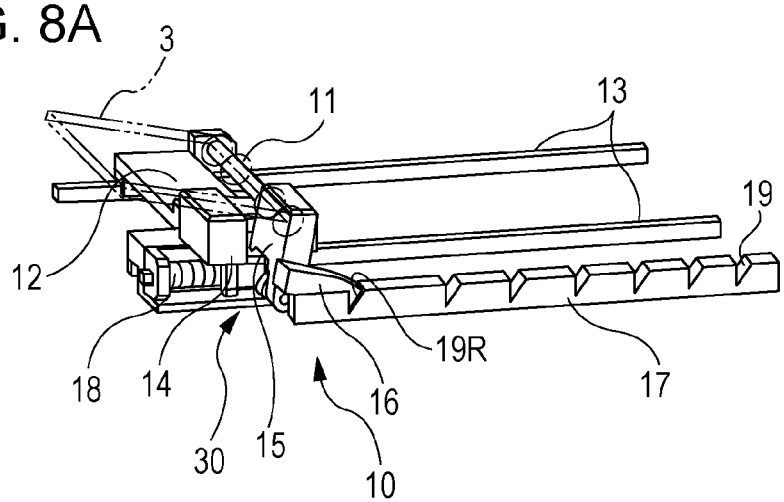
FIG. 8A is a partially enlarged perspective view illustrating a structure of the slide and lock mechanism of a first rotation axis of the link mechanism, which is provided on the side of the body part, and illustrating a state of the slide and lock mechanism, which is obtained when the information apparatus is in the state illustrated in FIG. 5A.
Figure 8B:
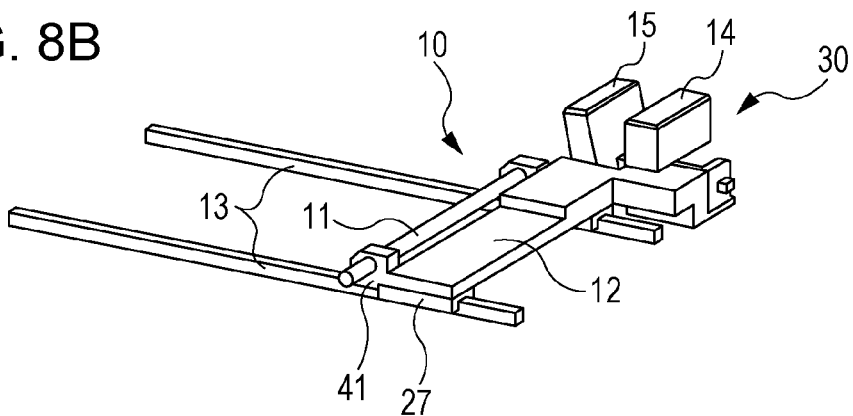
FIG. 8B is a perspective view illustrating the slide and lock mechanism in FIG. 8A, which is viewed from the opposite side.
Figure 8C:
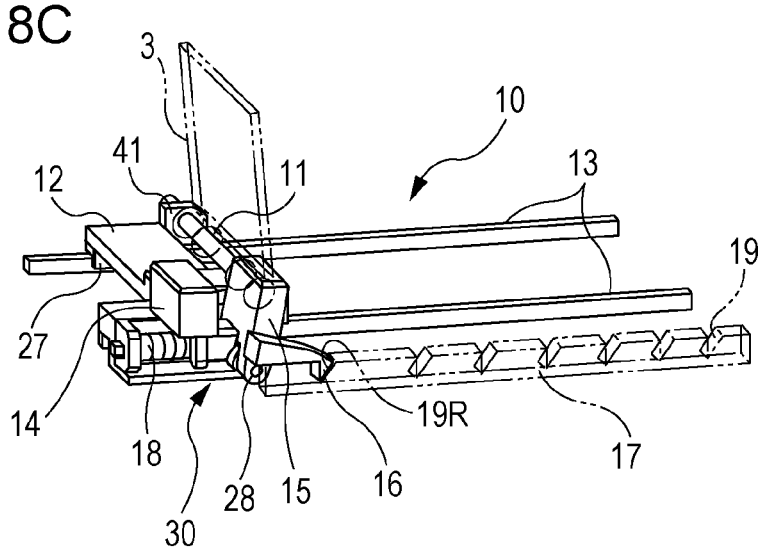
FIG. 8C is a partially enlarged perspective view illustrating a state of the slide and lock mechanism, which is obtained when the information apparatus is in the state illustrated in FIG. 5C.

The slide and lock mechanism 10 that is provided on the rear side of the link mechanism 32 and causes the first brackets 41 pivotally supporting the first rotation axis 11 to slide and be locked at a desired position is now described. FIG. 8A illustrates the structure of the slide and lock mechanism 10 of the first rotation axis 11 provided to the link mechanism 32 on the side of the body part 1, and illustrates a state of the slide and lock mechanism 10 viewed when the body part 1 and the display part 2 are in the state illustrated in FIG. 5A. This state is also illustrated in FIG. 6A. FIG. 8B is illustrated when the slide and lock mechanism 10 illustrated in FIG. 8A is viewed from the opposite side. FIG. 8C illustrates a state of the slide and lock mechanism 10 viewed when the body part 1 and the display part 2 are in the state illustrated in FIG. 5C. This state is also illustrated in FIG. 7A.

The slide and lock mechanism 10 includes the slide plate 12 that connects the first brackets 41 pivotally supporting both ends of the first rotation axis 11 of the link 3, and sliders 27 provided to an under surface of the slide plate 12 slide over the slide rails 13. The two slide rails 13 are arranged on the upper surface of the body part 1. The lock-groove rail 17 with the lock grooves 19 is provided on the side of one of the slide rails 13, and a lock lever mechanism 30 that engages with the lock-groove rail 17 is provided in an end portion of the slide plate 12 on the side of the lock-groove rail 17.

The lock lever mechanism 30 includes the slide lever 14, the unlock lever 15, which are integrally provided to the slide plate 12, and the lock hook 16 that engages with the lock groove 19 of the lock-groove rail 17, and is part of the slide and lock mechanism 10. The unlock lever 15 is attached to the slide plate 12 with a rotation axis 28 at a position that faces the slide lever 14, and is normally urged by the unlock lever urging member 18 in a direction away from the slide lever 14. As illustrated in FIGS. 8A and 8C, from the state in which the display part 2 is superposed over the body part 1 to the state in which the display part 2 is caused to slide and tilt with respect to the body part 1 and the sliding and tilting movement is completed, the lock hook 16 engages with a reference groove 19R of the lock-groove rail 17.

Figure 9A:
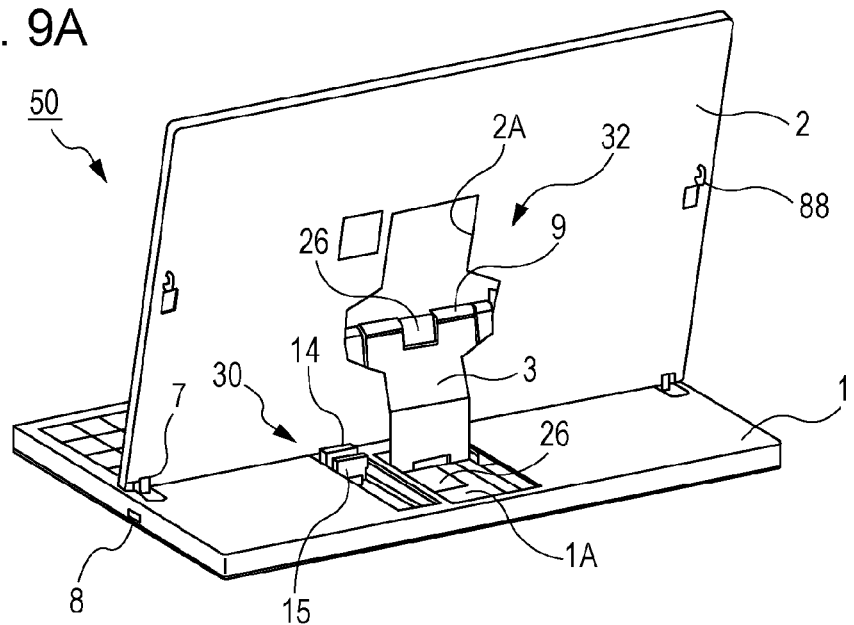
FIG. 9A is a perspective view of the information apparatus provided with the link mechanism according to the second embodiment, which is illustrated by viewing the information apparatus from the back surface side when the information apparatus is in a state in which the display part of the information apparatus completes tilting.

FIG. 9A illustrates the information apparatus 50 in the state in which the sliding and tilting movement of the display part 2 with respect to the body part 1 is completed with the link mechanism 32 of the second embodiment, which is viewed from the back surface side. The upper surface of the body part 1 and the back surface of the display part 2 are provided with depressed portions 1A and 2A that accommodate the link mechanism 32 when the display part 2 is superposed over the body part 1. In the state in which the sliding and tilting movement of the display part 2 with respect to the body part 1 is completed, the slide lever 14 and the unlock lever 15 of the lock lever mechanism 30 project from the upper surface of the body part 1.

Figure 9B:
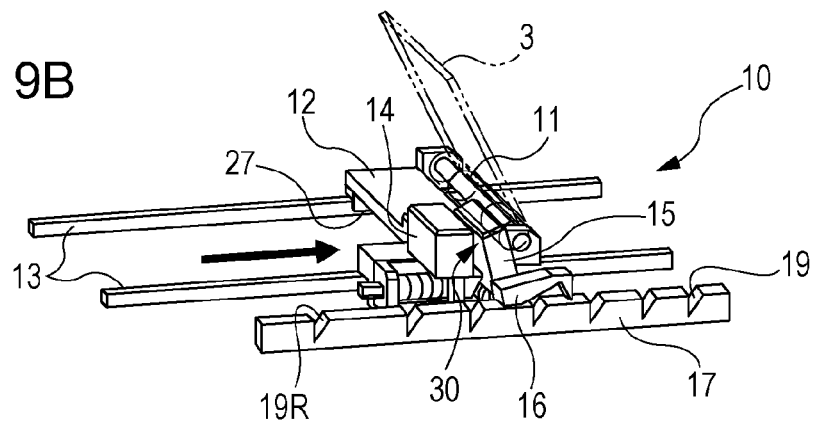
FIG. 9B is a partially enlarged perspective view illustrating a state of the slide and lock mechanism, which is viewed when the slide and lock mechanism moves from the state illustrated in FIG. 8C and the tilt angle of the display part is changed.
Figure 9C:
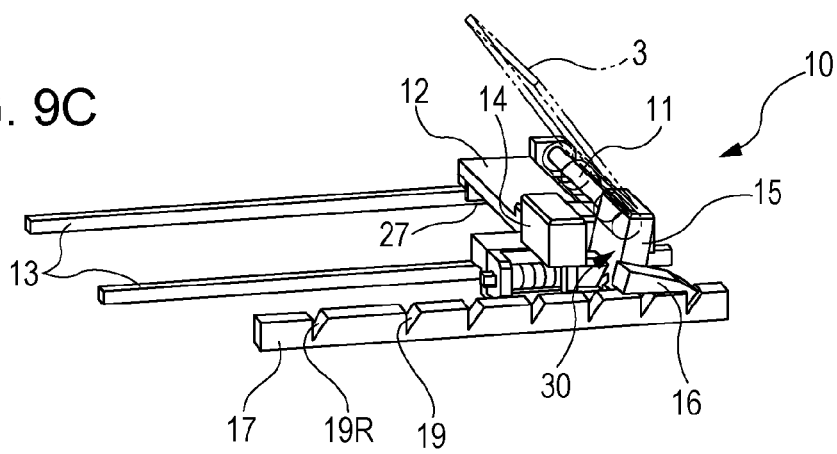
FIG. 9C is a partially enlarged perspective view illustrating a state of the slide and lock mechanism, which is viewed when the tilt angle from a horizontal surface of the display part is minimized by causing the slide and lock mechanism to move from the state illustrated in FIG. 9B.

Accordingly, when the tilt angle of the display part 2 with respect to the body part 1 is changed, a user of the information apparatus 50 holds the slide lever 14 and the unlock lever 15 with a finger and causes the unlock lever 15 to move toward the side of the slide lever 14. When the unlock lever 15 is caused to move toward the side of the slide lever 14, the lock hook 16 illustrated in FIGS. 8A and 8C is removed from the reference groove 19R, and then the lock lever mechanism 30 may move freely with respect to the lock-groove rail 17. When the slide lever 14 that has been held is caused to move toward the rear side of the body part 1 as illustrated in FIG. 9B, the slide plate 12 moves over the slide rails 13 and the angle of the link 3 changes, and thus, the tilt angle of the display part 2 may be changed. FIG. 9C illustrates a state of the slide and lock mechanism 10 and the lock lever mechanism 30, in which the slide and lock mechanism 10 is moved from the state illustrated in FIG. 9B and the tilt angle from a horizontal surface of the display part 2 is minimized.

Figure 7B:
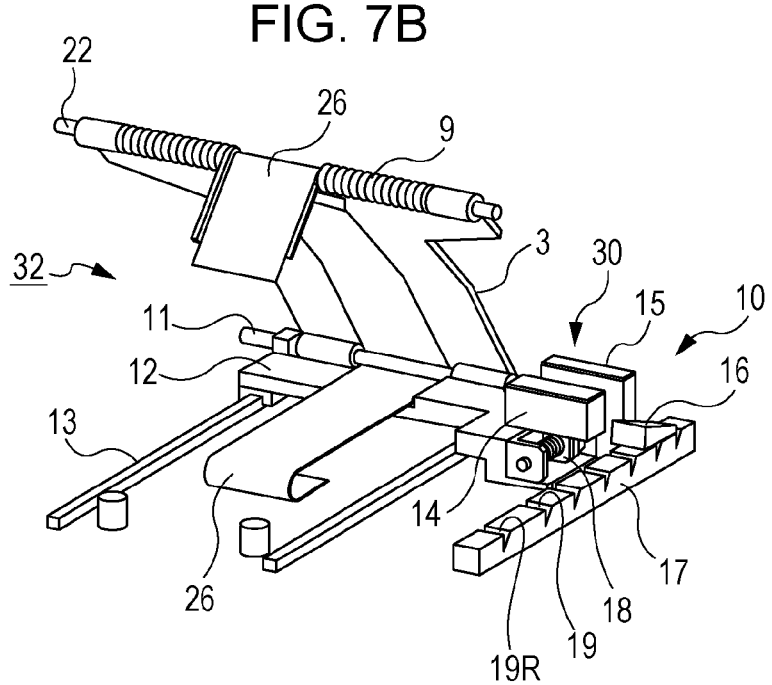
FIG. 7B is a perspective view illustrating a state of the link mechanism, which is obtained when the slide and lock mechanism moves from the state illustrated in FIG. 7A and the tilt angle of the display part is changed.
Figure 10A:
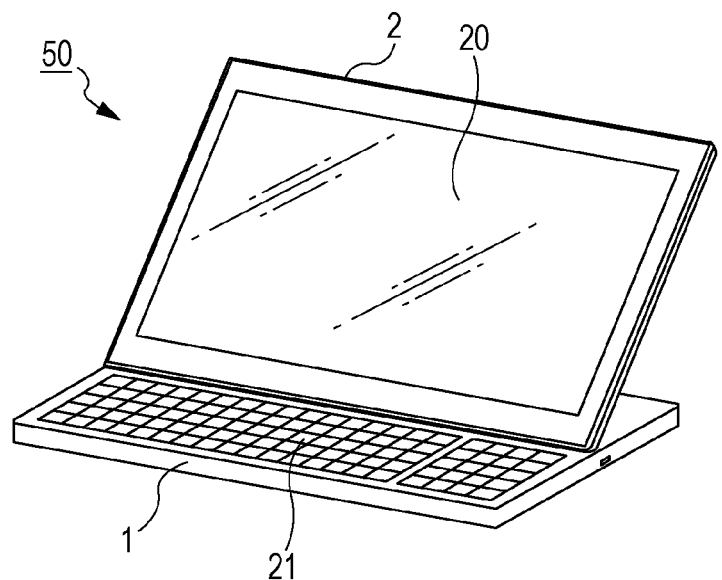
FIG. 10A is a perspective view of the information apparatus illustrating the state in which the tilt angle of the display part is changed from the state in which the sliding and tilting movement is completed as illustrated in FIG. 4C.
Figure 10B:
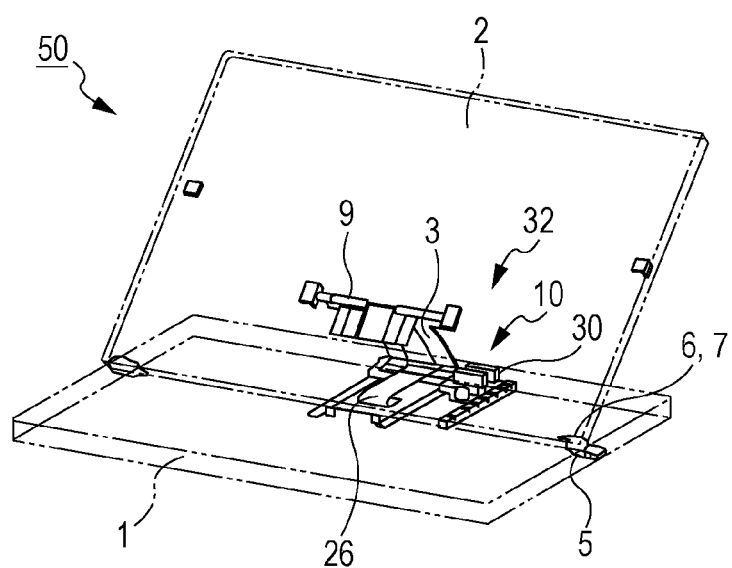
FIG. 10B is a skeleton view of the information apparatus illustrating a movement state of the link mechanism, the running roller, the slide and lock mechanism, and the close lock mechanism according to the second embodiment, which are in the state illustrated in FIG. 10A.

FIG. 10A illustrates a state of the information apparatus 50, which is obtained when the tilt angle of the display part 2 is changed as much as possible from the state in which the sliding and tilting movement of the display part 2 is completed as illustrated in FIG. 4C. FIG. 10B is a skeleton view of the information apparatus 50, which illustrates a movement state of the link mechanism 32, the running roller 5, the rotation axis 6 of the running roller 5, the slide and lock mechanism 10, the lock lever mechanism 30, and the rotation axis support part 7, which are in the state illustrated in FIG. 10A. Further, FIG. 7B is a perspective view enlarging and illustrating the link mechanism 32 by taking only the link mechanism 32 out of FIG. 10B. As may be seen in FIG. 7B, when the tilt angle of the display part 2 is changed as much as possible, the lock hook 16 of the lock lever mechanism 30 engages with the lock groove 19 positioned farthest away from the reference groove 19R of the lock-groove rail 17. The FPC 26 that couples an electric circuit in the body part 1 and an electric circuit in the display part 2 is also deformed with the movement of the link 3 of the link mechanism 32.

Figure 11A:
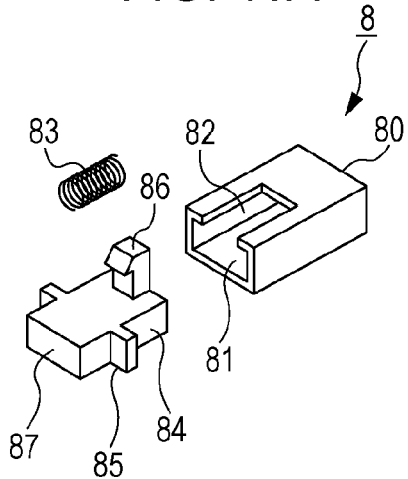
FIG. 11A is an exploded perspective view illustrating a structure of a close lock mechanism according to a variation, which stops the display part with respect to the body part.

FIG. 11A illustrates the structure of the close lock mechanism 8 according to a variation, which stops the display part 2 with respect to the body part 1, by dismantling the close lock mechanism 8. The close lock mechanism 8 includes a case 80, which is hollow, and the case 80 includes an opening portion 81 at one end. An upper surface of the case 80 is provided with an upper opening 82 that connects with the opening portion 81. A spring 83 is inserted into the case 80 from the opening portion 81 and after that, a slide member 84 is inserted into the case 80. Both side surfaces of the slide member 84 are provided with projecting stoppers 85 and the slide member 84 may be pushed to the inside of the case 80 until the stoppers 85 come into contact with an edge portion of the opening portion 81. Further, an upper surface of an end portion of the slide member 84, which is on the side farther than the stoppers 85, is provided with a lock projection 86. The lock projection 86 is inserted into the upper opening 82 when the slide member 84 is inserted into the case 80. In the close lock mechanism 8 structured as described above, an end surface of the slide member 84, which is on the side on which the stoppers 85 are provided, serves as an unlock button 87.

Figure 11B:
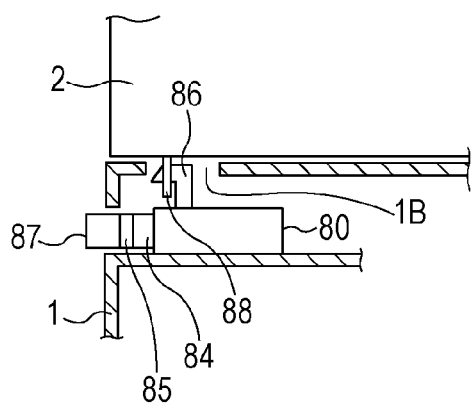
FIG. 11B is a partially enlarged sectional view illustrating a state in which the display part is locked with respect to the body part with the close lock mechanism illustrated in FIG. 11A.

FIG. 11B illustrates a state in which the close lock mechanism 8 illustrated in FIG. 11A is attached to the inside of the body part 1 and the display part 2 is locked with respect to the body part 1, and a top end portion of the slide member 84 projects from the body part 1 as the unlock button 87. A housing of the body part 1 positioned immediately over the close lock mechanism 8 attached to the body part 1 includes a hole 1B for allowing a projecting lock loop 88 provided to the back surface of the display part 2 to pass. The lock loop 88 is a stopped member that is stopped by the lock projection 86, and FIG. 9A illustrates the shape and the position of the lock loop 88. In the state in which the display part 2 is superposed over the body part 1, the lock loop 88 provided to the display part 2 is stopped by the lock projection 86 of the close lock mechanism 8, and thus, the display part 2 does not open from the body part 1.

Figure 11C:
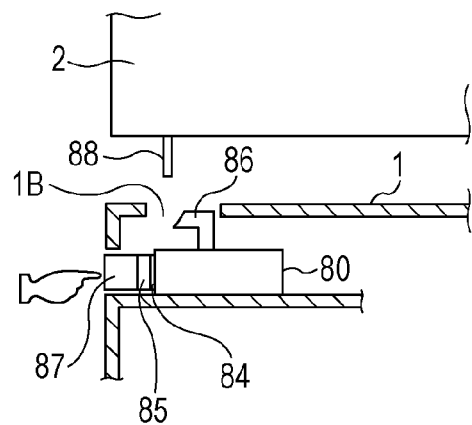
FIG. 11C is partially enlarged sectional view illustrating a state in which the lock of the display part and the body part is undone with the close lock mechanism illustrated in FIG. 11B.

When the unlock button 87 is pushed in the state illustrated in FIG. 11B as illustrated in FIG. 11C, the slide member 84 is pushed into the case 80 until the stoppers 85 come into contact with the case 80, and the lock projection 86 moves in the upper opening 82. When the lock loop 88 becomes separated from the lock projection 86 because of the movement of the lock projection 86, the link mechanism 32 described above allows the display part 2 to open with respect to the body part 1. When pushing the unlock button 87 is stopped, the slide member 84 returns to the position illustrated in FIG. 11B. When the display part 2 is superposed over the body part 1 in this state, the lock loop 88 comes into contact with the lock projection 86. However, since an upper surface of the lock projection 86 is provided with a taper portion, the lock loop 88 pushes the taper portion and causes a slider to be deeply inserted into the case 80. This movement causes the state illustrated in FIG. 11B, in which the lock loop 88 is locked at the lock projection 86.

Figure 11D:
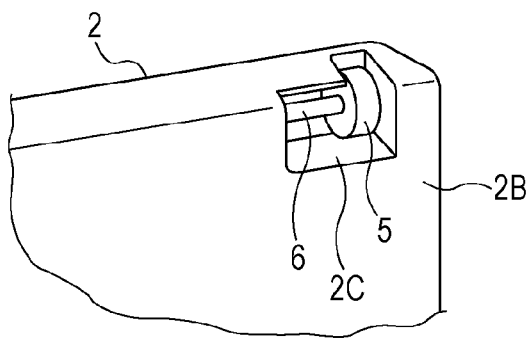
FIG. 11D is a partially enlarged perspective view illustrating a structure of a running roller according to the variation, which is provided to a lower end portion of the display part.
Figure 11E:
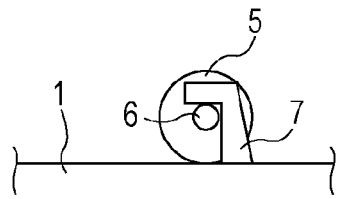
FIG. 11E is a partially enlarged sectional view illustrating a state in which a rotation axis of the running roller illustrated in FIG. 11D is stopped by a rotation axis support part.

FIG. 11D illustrates the structure of the running roller 5 according to a variation, which is provided to the lower end portion 2B of the display part 2. The lower end portion 2B on each side of the display part 2 is provided with a depressed portion 2C, and the running roller 5 attached to the rotation axis 6 is provided in the depressed portion 2C. An outer surface of the running roller 5 slightly projects from the depressed portion 2C, and when the display part 2 starts the sliding and tilting movement, the running roller 5 comes into contact with the upper surface of the body part 1. FIG. 11E illustrates a state in which the rotation axis 6 of the running roller 5 illustrated in FIG. 11D is stopped by the projecting rotation axis support part 7 provided to the upper surface of the body part 1, and is a view by partially enlarging, for example, the engaging state of the rotation axis 6 and the rotation axis support part 7 illustrated in FIGS. 2A and 5C. The rotation axis 6 stopped by the rotation axis support part 7 serves as a rotation axis when the tilt angle of the display part 2 is changed.

The information apparatus 50 to which the above-described link mechanism 32 according to the second embodiment is attached may be used in the state in which the display part 2 is superposed over the body part 1 as illustrated in FIG. 4A, and in the state in which the display part 2 is raised and tilted from the body part 1 as illustrated in FIG. 4C. Also, the information apparatus 50 may be used by changing the tilt angle of the display part 2 from the state in which the display part 2 is raised and tilted from the body part 1 as illustrated in FIG. 10A. Since the keyboard 21 is exposed in the states illustrated in FIGS. 4C and 10A, input using the keyboard 21 may be performed on the information apparatus 50.

In contrast, when the touch-panel display 20 is provided to the body part 1, input using the touch-panel display 20 may be performed in the state illustrated in FIG. 4A. When performing the input using the touch-panel display 20, it may be convenient to slightly tilt the display part 2 with respect to the body part 1 as illustrated in FIG. 12C. Thus, a variation in which a tilt lock mechanism that may change the display part 2 into the state illustrated in FIG. 12C is added to the link mechanism 32 according to the second embodiment is described with reference to FIGS. 12A to 14B.

Figure 12A:
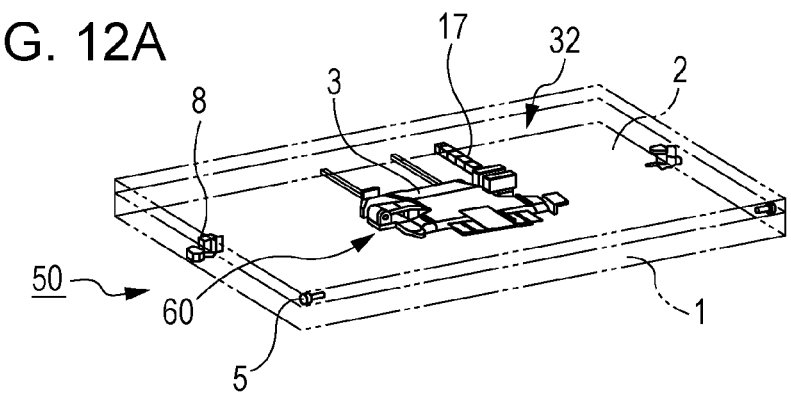
FIG. 12A is a skeleton view illustrating an information apparatus including a link mechanism according to a variation, in which a tilt lock mechanism that halts the sliding and tilting movement of the display part, which has been in progress, is added to the link mechanism illustrated in FIG. 5A.
Figure 12B:
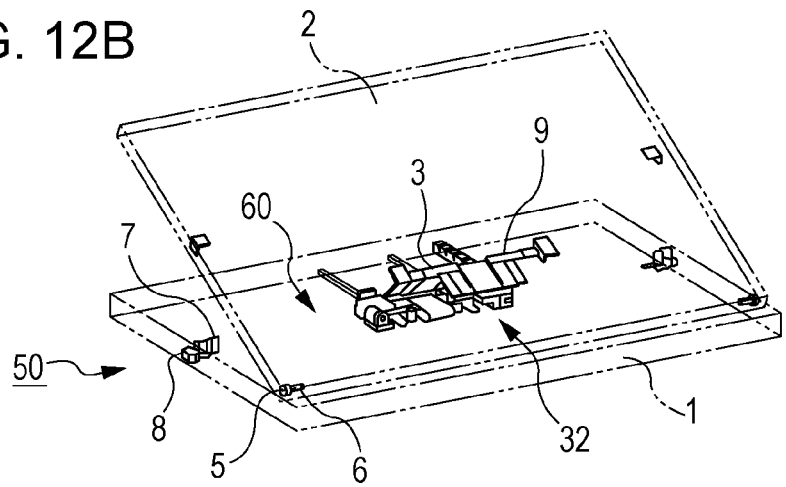
FIG. 12B is a skeleton view of the information apparatus illustrating a state in which the sliding and tilting movement that the display part has started from the closed state is halted with the tilt lock mechanism.
Figure 12C:
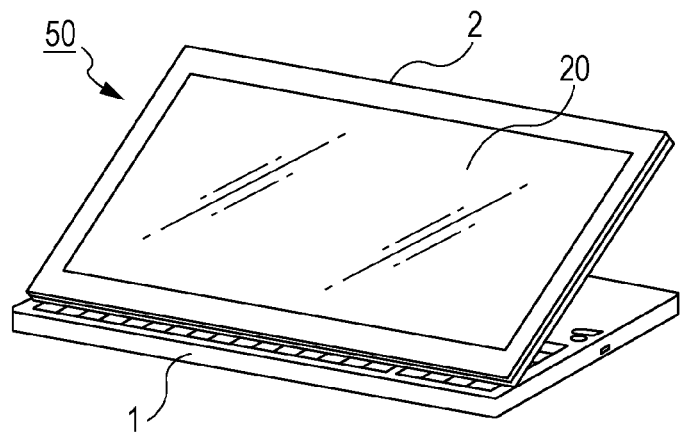
FIG. 12C is a perspective view illustrating an appearance of the information apparatus in the state illustrated in FIG. 12B.

FIG. 12A is a skeleton view illustrating the information apparatus 50 including the link mechanism 32 according to the variation of the embodiment, in which a tilt lock mechanism 60 that halts the sliding and tilting movement of the display part 2 from the body part 1, which has been in progress, is added to the link mechanism 32 illustrated in FIG. 5A. The tilt lock mechanism 60 is provided on the side opposite the side on which the lock-groove rail 17 of the link mechanism 32 is provided. FIG. 12B is a skeleton view illustrating movement of the tilt lock mechanism 60, which is performed in the state illustrated in FIG. 12C. When the lock of the close lock mechanism 8 is undone and the link mechanism 32 allows the display part 2 to start the sliding and tilting movement with respect to the body part 1, the tilt lock mechanism 60 halts the movement of the link mechanism 32 in the state in which the display part 2 is slightly tilted.

Figure 13A:
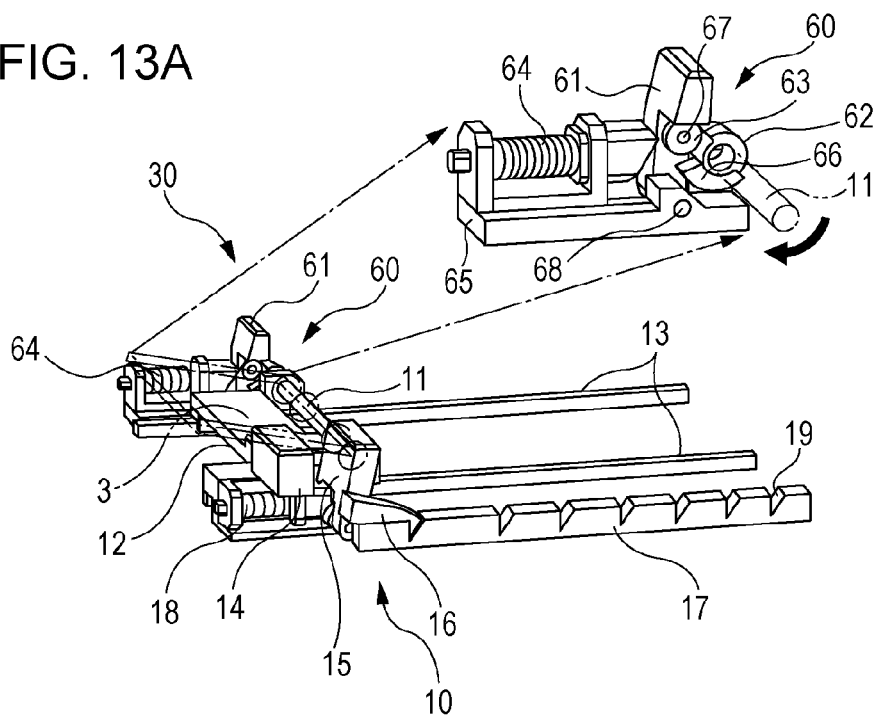
FIG. 13A is a partially enlarged perspective view illustrating a state in which the tilt lock mechanism is attached to the link mechanism according to the second embodiment and the display part is closed.

FIG. 13A illustrates the slide and lock mechanism 10 and the tilt lock mechanism 60 in a state in which the tilt lock mechanism 60 is attached to the link mechanism 32 according to the second embodiment and the display part 2 is closed. Since the structure of the slide and lock mechanism 10 has been already described, substantially the same members are given the same references and the explanation on the members is omitted. The tilt lock mechanism 60 includes an unlock lever 61 that may swing about a rotation axis 68 over a body 65 arranged on the body part 1, and the unlock lever 61 includes a roller 63 attached to a rotation axis 67.

A lock cam 62 that engages with the roller 63 is fixed to the first rotation axis 11 provided to the link 3 of the link mechanism 32 on the side of the body part 1. The lock cam 62 is provided with a cut portion 66, and the roller 63 is positioned in the cut portion 66 in the state in which the display part 2 is closed with respect to the body part 1. The unlock lever 61 is urged by a lever urging part 64 provided to the body 65 in a direction of the lock cam 62.

Figure 13B:
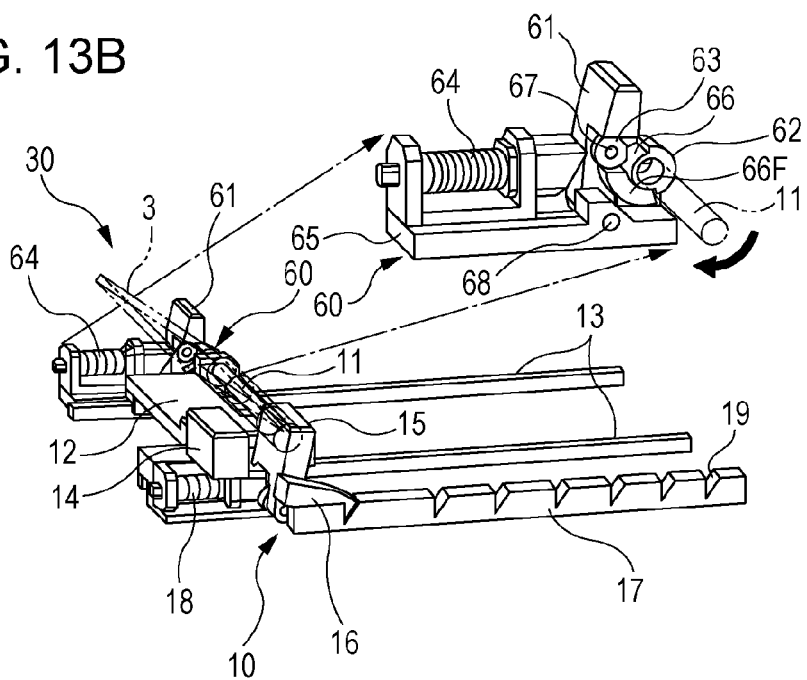
FIG. 13B is a partially enlarged perspective view illustrating a state in which the sliding and tilting movement of the display part, which has been in progress, is halted with the tilt lock mechanism illustrated in FIG. 13A.

When the lock of the close lock mechanism 8 is undone and the link mechanism 32 allows the display part 2 to start the sliding and tilting movement with respect to the body part 1, the first rotation axis 11 rotates in a direction indicated by an arrow. When the display part 2 continues the sliding and tilting movement with respect to the body part 1, as illustrated in FIG. 13B, an end surface 66F of the cut portion 66 of the lock cam 62 fixed to the first rotation axis 11 comes into contact with the roller 63. Then, the rotation of the first rotation axis 11 is stopped and the movement of the link 3 of the lock lever mechanism 30 is stopped, and the display part 2 halts the sliding and tilting movement with respect to the body part 1. This state is illustrated in FIGS. 12B and 12C. Thus, the sliding and tilting movement of the display part 2 may be stopped, which has been in progress, when the tilt lock mechanism 60 is attached to the link mechanism 32.

Figure 14A:
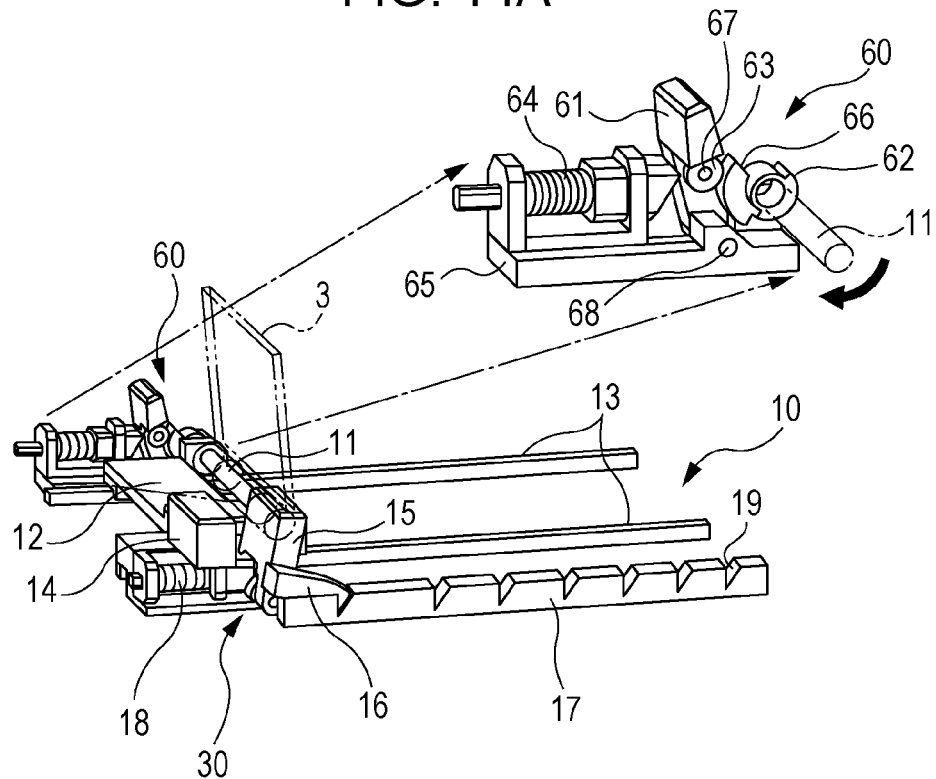
FIG. 14A is a partially enlarged perspective view illustrating a state in which the sliding and tilting movement of the display part is completed after the halt movement for the sliding and tilting movement of the display part by the tilt lock mechanism has been undone.

When undoing the movement of the tilt lock mechanism 60 for halting the sliding and tilting movement of the display part 2, which has been in progress, the unlock lever 61 is caused to rotate toward the side of the lever urging part 64 against the urging force caused by the lever urging part 64 as illustrated in FIG. 14A. Then, the roller 63 provided to the unlock lever 61 comes out of the cut portion 66 of the lock cam 62, the stop of the lock cam 62 by the roller 63 is undone and the first rotation axis 11 may resume the rotation in the direction indicated by the arrow. When the roller 63 comes out of the cut portion 66 of the lock cam 62 and the first rotation axis 11 resumes the rotation in the direction indicated by the arrow, the unlock lever 61 may be left open. The roller 63 runs over the outer surface of the lock cam 62 in the state in which the unlock lever 61 is left open. FIG. 14A illustrates a state in which the sliding and tilting movement of the display part 2 is completed after the halt movement of the tilt lock mechanism 60, which is performed on the sliding and tilting movement of the display part 2, has been undone.

Figure 14B:
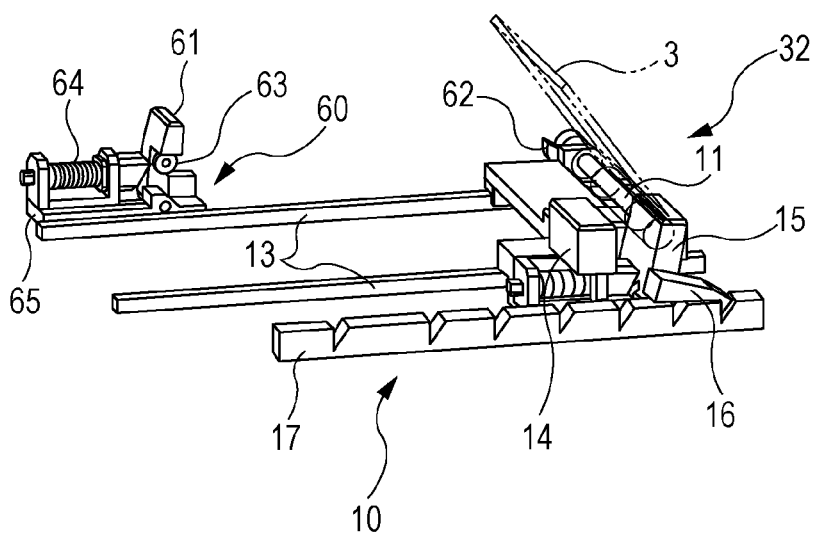
FIG. 14B is partially enlarged perspective view illustrating a state in which the tilt angle of the display part is changed by the link mechanism from the state illustrated in FIG. 14A with the slide and lock mechanism.

The tilt lock mechanism 60 is provided next to the link mechanism 32, independent of the link mechanism 32. Thus, because of the slide and lock mechanism 10 of the link mechanism 32, the position of the tilt lock mechanism 60 remains unchanged as illustrated in FIG. 14B even when the slide and lock mechanism 10 moves over the slide rails 13 to change the tilt angle of the display part 2.

When the display part 2 is closed from the state illustrated in FIG. 14A, the first rotation axis 11 provided to the link 3 of the link mechanism 32 rotates in a direction opposite the direction indicated by the arrow. Since in this case, the roller 63 runs over the outer surface of the lock cam 62, even when the roller 63 comes to the position of the cut portion 66, the roller 63 merely enters the cut portion 66 and does not stop the rotation of the first rotation axis 11. Thus, when the display part 2 is closed, the presence of the tilt lock mechanism 60 does not affect the movement of closing the display part 2.

When the close lock mechanism 8 is pushed, the urging force of the assistance spring causes the display part 2 to open from the body part 1 and the information apparatus 50 provided with the link mechanism 32 according to the second embodiment between the body part 1 and the display part 2 is changed to the tilted state as illustrated in FIGS. 4A to 4C. At this time, the display part 2 is opened from the body part 1 slowly and the information apparatus 50 is changed to the tilt state by providing the link mechanism 32 with a damper mechanism. Thus, another variation in which a damper mechanism 70 that may cause the display part 2 to open from the body part 1 slowly is added to the link mechanism 32 according to the second embodiment is described with reference FIGS. 15A to 18B.

Figure 15A:
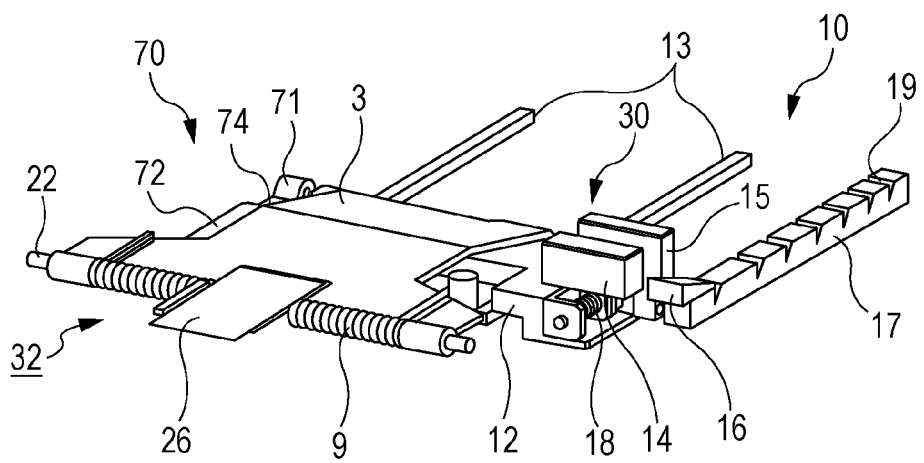
FIG. 15A illustrates the same part as the part of the link mechanism illustrated in FIG. 6A, which is obtained when a damper mechanism is added to the link mechanism according to the second embodiment, and is a perspective view of the link mechanism in the state in which the display part is closed.
Figure 15B:
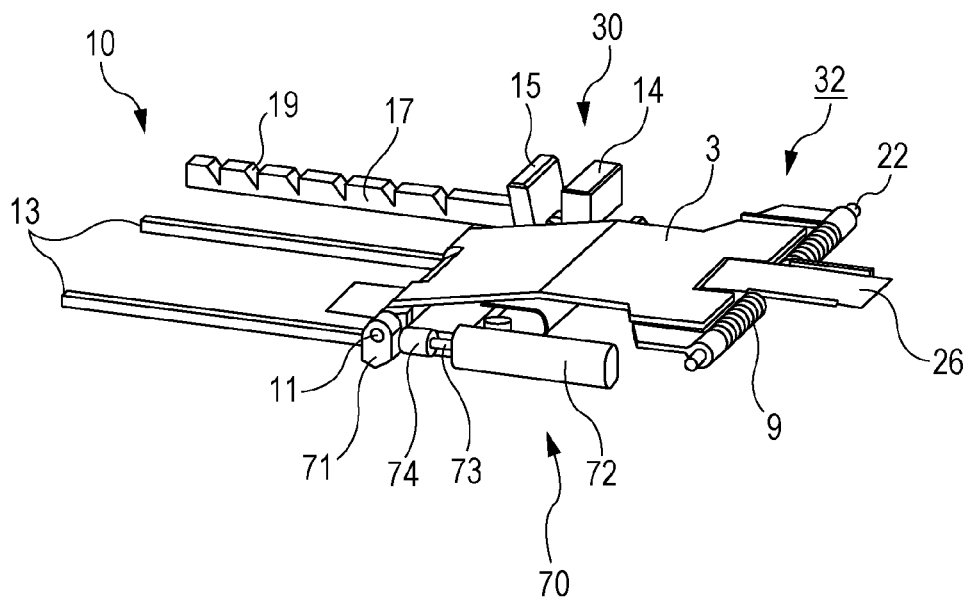
FIG. 15B is a perspective view illustrating the link mechanism provided with the damper mechanism illustrated in FIG. 15A, which is viewed from the opposite side.

FIG. 15A illustrates the same part of the link mechanism 32 as the part illustrated in FIG. 6A, which is obtained when a damper mechanism 70 is added to the link mechanism 32 according to the second embodiment, and illustrates the link mechanism 32 in the state in which the display part 2 is closed. FIG. 15B illustrates the link mechanism 32 provided with the damper mechanism 70 illustrated in FIG. 15A, which is viewed from the opposite side. The damper mechanism 70 is provided on the side opposite the lock lever mechanism 30 provided to the link mechanism 32.

The damper mechanism 70 includes a damper cam 71 fixed to the first rotation axis 11 of the link 3, a damper 72, an appearing and disappearing rod 73, and a contactor 74. The contactor 74 is attached to a top end portion of the appearing and disappearing rod 73 and is in contact with an outer surface of the damper cam 71 until the sliding and tilting movement is completed from the state in which the display part 2 is closed. The portion of the outer surface of the damper cam 71, which is in contact with the contactor 74, is formed so that the distance from the first rotation axis 11 is the shortest in the state in which the display part 2 is closed, and is the longest in the state in which the display part 2 completes tilting. When the contactor 74 is pushed by the damper cam 71, the appearing and disappearing rod 73 is caused to disappear into the damper 72, and the damper 72 causes the appearing and disappearing rod 73 to enter the damper 72 at a low speed. Also, when the appearing and disappearing rod 73 comes out of the damper 72, the damper 72 ejects the appearing and disappearing rod 73 at a low speed.

Figure 16A:
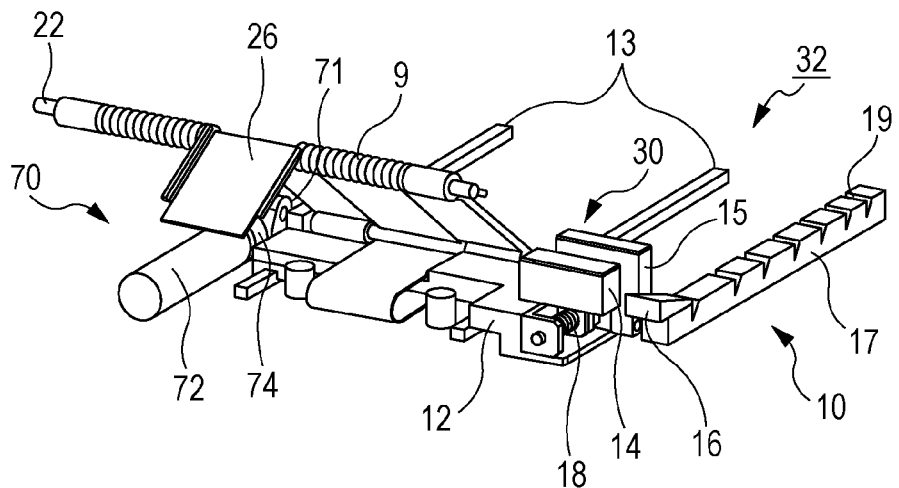
FIG. 16A is a perspective view illustrating a state in which the display part performs the sliding and tilting movement from the state illustrated in FIG. 15A.
Figure 16B:
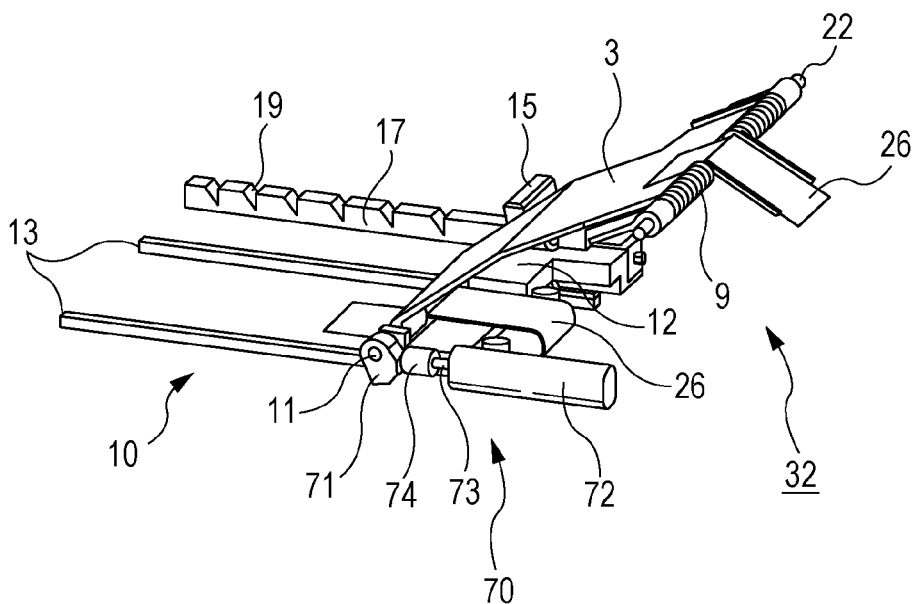
FIG. 16B is a perspective view illustrating the link mechanism provided with the damper mechanism illustrated in FIG. 16A, which is viewed from the opposite side.

FIG. 16A illustrates a state of the damper mechanism 70, which is viewed when the display part 2 performs the sliding and tilting movement from the state illustrated in FIG. 15A, and FIG. 16B illustrates the link mechanism 32 provided with the damper mechanism 70, which is obtained by viewing the link mechanism 32 illustrated in FIG. 16A from the opposite side. When the display part 2 performs the sliding and tilting movement, the first rotation axis 11 rotates, the link 3 rises upward, and the damper cam 71 rotates accordingly. As the damper cam 71 rotates, the distance between the portion in contact with the contactor 74 and the first rotation axis 11 becomes longer and the contactor 74 is pushed such that the appearing and disappearing rod 73 disappears into the damper 72. However, the speed at which the contactor 74 disappears is suppressed by the action of the damper 72. As a result, the speed at which the link 3 rises is low and the display part 2 performs the sliding and tilting movement slowly.

Figure 17A:
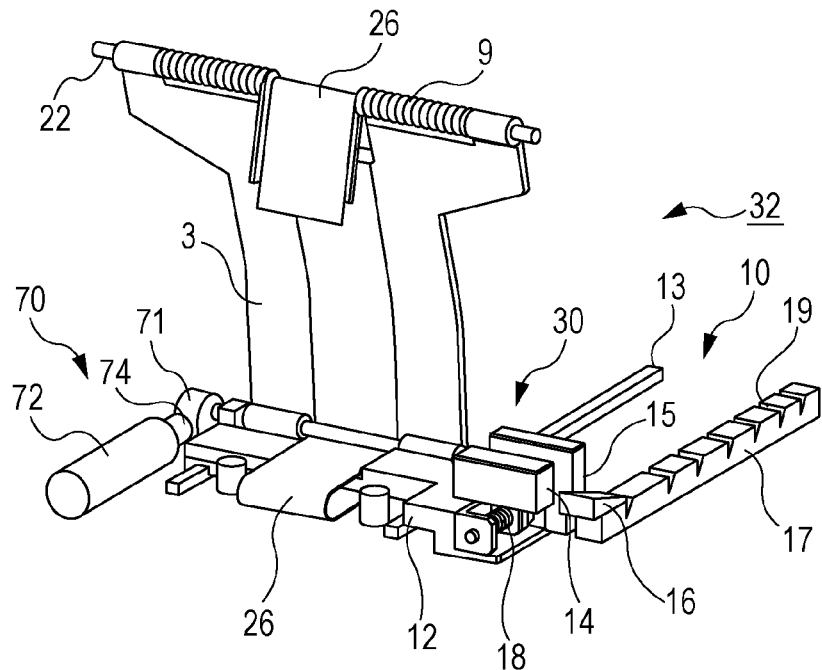
FIG. 17A is a perspective view illustrating a state in which the display part further performs the sliding and tilting movement from the state illustrated in FIG. 16A and the sliding and tilting movement is completed.
Figure 17B:
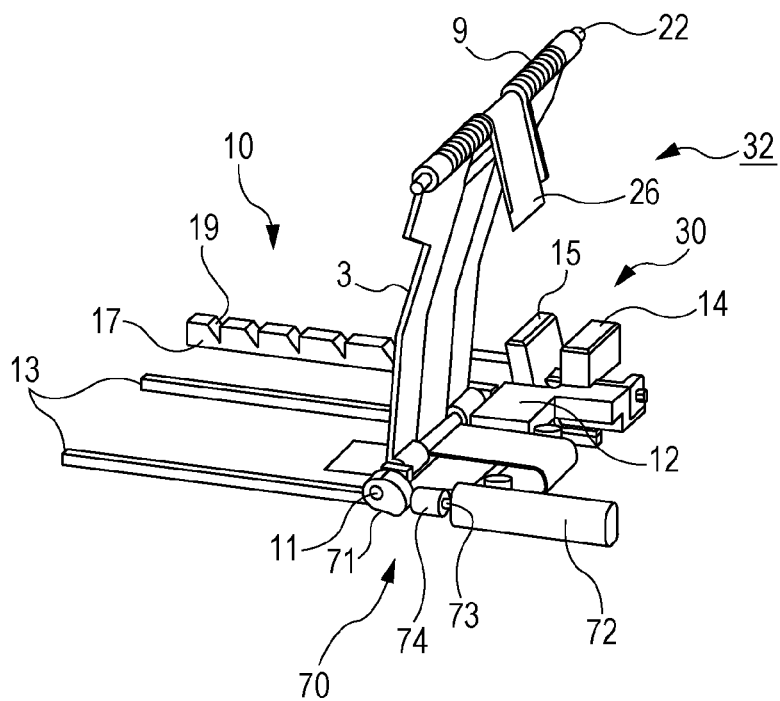
FIG. 17B is a perspective view illustrating the link mechanism provided with the damper mechanism illustrated in FIG. 17A, which is viewed from the opposite side.

FIG. 17A illustrates a state in which the display part 2 further performs the sliding and tilting movement from the state illustrated in FIG. 16A and the sliding and tilting movement is completed. FIG. 17B illustrates the link mechanism 32 provided with the damper mechanism 70 illustrated in FIG. 17A, which is viewed from the opposite side. When the sliding and tilting movement of the display part 2 is completed, the rotation of the first rotation axis 11 of the link 3 stops, and the distance from the first rotation axis 11 to the contact portion of the damper cam 71 and the contactor 74 becomes the longest and the disappearance amount of the appearing and disappearing rod 73 in the damper 72 becomes the largest. Thus, until the display part 2 reaches a slide and tilt completion position by performing the sliding and tilting movement, the speed at which the contactor 74 disappears is suppressed by the action of the damper 72, and the display part 2 moves to the slide and tilt completion position slowly.

Since the damper cam 71 is not affected by the damper mechanism 70 when the display part 2 returns to the state illustrated in FIGS. 15A and 15B, in which the display part 2 is closed, from the slide and tilt completion position illustrated in FIGS. 17A and 17B, the display part 2 may be closed speedily. After the display part 2 is closed, the appearing and disappearing rod 73 is slowly pushed from the damper 72 and then the contactor 74 comes into contact with the damper cam 71.

Figure 18A:
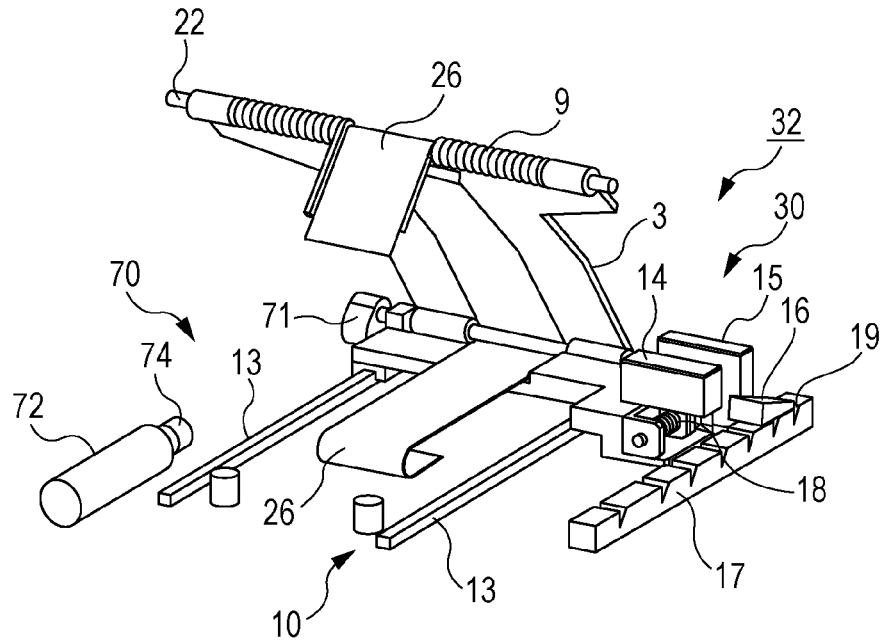
FIG. 18A is a perspective view illustrating a state in which the tilt angle of the display part is changed with the slide and lock mechanism from the state in which the display part completes tilting as illustrated in FIG. 17A.
Figure 18B:
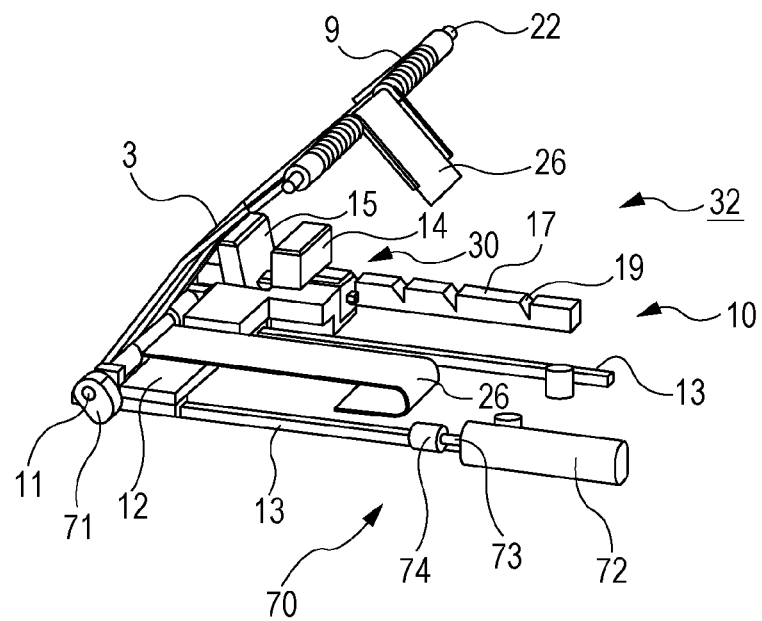
FIG. 18B is a perspective view illustrating the link mechanism provided with the damper mechanism illustrated in FIG. 18A, which is viewed from the opposite side.

FIG. 18A illustrates a state in which the tilt angle of the display part 2 is changed with the slide and lock mechanism 10 from the state illustrated in FIG. 17A, in which the sliding and tilting movement of the display part 2 is completed. FIG. 18B illustrates the link mechanism 32 provided with the damper mechanism 70 illustrated in FIG. 18A, which is viewed from the opposite side. Since the damper 72 of the damper mechanism 70 is fixed to the body part 1, when the tilt angle of the display part 2 is changed with the slide and lock mechanism 10, the damper mechanism 70 does not affect the movement.

An information apparatus provided with a link mechanism, which is structured as described above, between a body part and a display part may have advantages listed below.

1. Since the display part is changed by a single-stage operation from a state in which the display part is superposed over the body part to a tilted state, a smooth operational feeling may be obtained.

2. Since a tilt angle may be changed further from the tilted state, a user may set the display part at an angle desired in order to see the display clearly such that the usability may increase.

3. Since the display part does not come out of an upper space of the body part when the display part changes from the state in which the display part is superposed over the body part to the tilted state, operations may be performed in a small space.

4. Since the display part is changed by a single-stage operation also when returning from the tilted state to the closed state, a smooth operational feeling may be obtained.

5. Since a lower end portion of the display part is held at a certain position when the tilt angle is changed further from the tilted state, a keyboard of the body part may be arranged also near a lower end of the display part, and an operation surface of the keyboard may be made wide such that the operability of the keyboard may increase.

6. Since in the link mechanism according to the second embodiment, a back side of the display part is supported with a link, the display part may not wobble when the touch panel is operated in the tilted state, and the display part may possess stiffness and the touch operation may be performed stably.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An information apparatus, comprising: a first housing and a second housing a link mechanism provided between spanned from a front side of the second housing and a rear side of the first housing in a state in which the second housing is superposed over the first housing, the link mechanism including a link provided with a first rotation axis at one end and provided with a second rotation axis at another end, a first bracket that pivotally supports the first rotation axis and is provided on a side of the first housing, a second bracket that pivotally supports the second rotation axis and is provided on a side of the second housing, and an urging part that urges the link in a direction in which the second rotation axis moves away from the first housing, wherein when the second housing tilts from the first housing, the link mechanism allows one end of the second housing to slide over the first housing and the second housing tilts in an upper space of the first housing, and wherein the link mechanism further includes a slide mechanism that allows the first bracket to move over the first housing and includes a slide rail that allows the first bracket to move, a lock-groove rail that is attached on the side of the first housing in parallel to the slide rail and is provided with a lock groove, and a lock lever mechanism that is engaged with or separated from the lock groove of the lock-groove rail and is attached to the first bracket.

2. The information apparatus according to claim 1, wherein
a lock mechanism that fixes the second housing onto the first housing in the state in which the second housing is superposed over the first housing, is provided between the first housing and the second housing, and
when lock of the lock mechanism is undone, the urging part causes the second housing to automatically tilt from the first housing.

3. The information apparatus according to claim 1, wherein
a damper mechanism that reduces a rotation speed when the link rotates and moves about the first rotation axis, is provided on the side of the first housing.

4. The information apparatus according to claim 1, wherein a stopping mechanism that stops sliding movement of the end of the second housing when the end of the second housing performs the sliding movement over the first housing, is provided on the first housing.

5. The information apparatus according to claim 4, wherein a portion that is at the end of the second housing and performs the sliding movement, is provided with a running roller attached to a rotation axis, and the stopping mechanism stops the rotation axis of the running roller.

6. The information apparatus according to claim 1, wherein the slide mechanism is provided on the side of the first housing and is capable of moving the first rotation axis in a direction away from the end of the second housing in a state in which the second housing is tilted from the first housing.

7. The information apparatus according to claim 1, wherein the slide mechanism fixes the first bracket in the state in which the second housing is superposed over the first housing and when the second housing tilts from the first housing, and stops movement of the first bracket in stages when the first bracket moves over the slide rail.

8. The information apparatus according to claim 5, wherein, when the first rotation axis moves in the direction away from the end of the second housing by the slide mechanism, the second housing rotates about the rotation axis of the running roller stopped by the stopping mechanism and a tilt angle is changed.

9. The information apparatus according to claim 1, wherein the lock lever mechanism includes a slide lever provided to the first bracket, and a lock hook that swings with respect to the slide lever and is capable of engaging with and separating from the lock groove of the lock-groove rail.

10. The information apparatus according to claim 1, wherein a tilt lock mechanism that stops rotation of the first rotation axis after the second housing has started tilting from the first housing in a state in which a rotation angle is small, and causes a state in which the tilt angle of the second housing is small, is provided near the first bracket.

11. An information apparatus, comprising:

a first housing and a second housing; and a link mechanism provided between a front side of the second housing and a rear side of the first housing in a state in which the second housing is superposed over the first housing, the link mechanism including:

a link provided with a first rotation axis at one end and provided with a second rotation axis at another end, a first bracket that pivotally supports the first rotation axis and is provided on a side of the first housing, a second bracket that pivotally supports the second rotation axis and is provided on a side of the second housing, and an urging part that urges the link in a direction in which the second rotation axis moves away from the first housing, wherein when the second housing tilts from the first housing, the link mechanism allows one end of the second housing to slide over the first housing and the second housing tilts in an upper space of the first housing, wherein a tilt lock mechanism that stops rotation of the first rotation axis after the second housing has started tilting from the first housing in a state in which a rotation angle is small, and causes a state in which the tilt angle of the second housing is small is provided near the first bracket, and wherein the tilt lock mechanism is provided with an unlock lever, and the second housing tilts to a position at which the end of the second housing is stopped by the stopping mechanism by operating the unlock lever.

12. The information apparatus according to claim 1, wherein the link mechanism couples the first housing and the second housing on side surfaces of the first housing and the second housing.

13. The information apparatus according to claim 1, wherein the link mechanism is provided between an upper surface of the first housing and a back surface of the second housing, and couples the first housing and the second housing.

14. The information apparatus according to claim 1, wherein a keyboard is provided to a top surface of the first housing, the surface appearing when the second housing is caused to slide and tilt with respect to the first housing.

15. A link mechanism of an information apparatus, the link mechanism being arranged between a first housing and a second housing and allowing the second housing to tilt in an upper space of the first housing from the first housing and the second housing in a superposed state, the link mechanism comprising: a link provided with a first rotation axis at one end and provided with a second rotation axis at another end; a first bracket that is provided over a side of the first housing and pivotally supports the first rotation axis; a second bracket that is provided over a side of the second housing and pivotally supports the second rotation axis; and an urging part that urges the link in a direction in which the second rotation axis moves away the first housing, wherein when the first bracket is attached to the first housing on a tilt-up side of the second housing and the second bracket is attached to the second housing on a side that serves as a base when the second housing tilts, the urging part causes one end of the second housing to slide over the first housing and perform tilting movement when the second housing tilts from the first housing wherein the first bracket is provided with a slide mechanism that allows the first bracket to move over the first housing and the slide mechanism includes a slide rail that allows the first bracket to move, a lock-groove rail that is attached on the side of the first housing in parallel to the slide rail and is provided with a lock groove, and a lock lever mechanism that is engaged with or separated from the lock groove of the lock-groove rail and is attached to the first bracket.

16. The link mechanism of the information apparatus according to claim 15, wherein a damper mechanism that reduces a rotation speed when the link rotates and moves about the first rotation axis is provided on the first housing.

17. The link mechanism of the information apparatus according to claim 15, wherein the slide mechanism allows the first bracket to move over the first housing in a state in which the second housing completes tilting from the first housing.

18. The link mechanism of the information apparatus according to claim 17, wherein the slide mechanism fixes the first bracket in the state in which the second housing is superposed over the first housing and when the second housing tilts from the first housing, and stops movement of the first bracket in stages when the first bracket moves over the slide rail.

19. The link mechanism of the information apparatus according to claim 18, wherein a lock mechanism that fixes the second housing onto the first housing in the state in which the second housing is superposed over the first housing is provided between the first housing and the second housing, and when lock of the lock mechanism is undone, the urging part causes the second housing to automatically tilt from the first housing.

20. The link mechanism of the information apparatus according to claim 15, wherein the lock lever mechanism includes
   a slide lever provided to the first bracket, and
   a lock hook that swings with respect to the slide lever and is capable of engaging with and separating from the lock groove of the lock-groove rail.

* * * * *